(12) United States Patent
Mikolajczak

(10) Patent No.: US 9,019,674 B2
(45) Date of Patent: Apr. 28, 2015

(54) INPUT POWER PORT PROTECTION COMPONENT

(75) Inventor: Adrian Mikolajczak, Los Altos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/982,939

(22) Filed: Dec. 31, 2010

(65) Prior Publication Data

US 2012/0127619 A1 May 24, 2012

Related U.S. Application Data

(60) Provisional application No. 61/416,567, filed on Nov. 23, 2010.

(51) Int. Cl.
*H02H 3/38* (2006.01)
*H02H 3/02* (2006.01)
*H02H 9/04* (2006.01)

(52) U.S. Cl.
CPC .............. *H02H 3/023* (2013.01); *H02H 9/041* (2013.01); *H02H 9/042* (2013.01)

(58) Field of Classification Search
CPC ...................................... H02H 3/38
USPC ........................................... 361/79
See application file for complete search history.

(56) References Cited

U.S. PATENT DOCUMENTS

| | | | |
|---|---|---|---|
| 3,370,219 A | 2/1968 | Hupp | |
| 3,702,418 A | 11/1972 | Obenhaus | |
| 4,061,962 A | 12/1977 | Stewart | |
| 4,163,186 A | 7/1979 | Haley | |
| 4,533,970 A | 8/1985 | Brown | |
| 4,652,964 A * | 3/1987 | Ziegenbein | 361/54 |
| 4,759,362 A | 7/1988 | Taniguchi | |
| 4,975,798 A | 12/1990 | Edwards et al. | |
| 5,164,874 A | 11/1992 | Okano et al. | |
| 5,379,176 A | 1/1995 | Bacon et al. | |
| 5,539,299 A | 7/1996 | Fernandez et al. | |
| 5,748,422 A | 5/1998 | Heaston et al. | |
| 5,763,929 A | 6/1998 | Iwata | |
| 5,973,977 A | 10/1999 | Boyd et al. | |
| 6,114,672 A | 9/2000 | Iwasaki et al. | |
| 6,320,275 B1 | 11/2001 | Okamoto et al. | |

(Continued)

FOREIGN PATENT DOCUMENTS

| | | |
|---|---|---|
| DE | 2917256 C2 | 11/1980 |
| DE | 10146947 A1 | 4/2003 |

OTHER PUBLICATIONS

Devices, et al., "An Investigation into the Physics of Blowing Polysilicon Fuses", Report for 62nd European Study Group with Industry, Limerick, 2008, pp. 1-13.

(Continued)

*Primary Examiner* — Thienvu Tran
*Assistant Examiner* — Ann Hoang
(74) *Attorney, Agent, or Firm* — Brake Hughes Bellermann LLP

(57) ABSTRACT

In one general aspect, an apparatus can include an overvoltage protection portion, and an overcurrent protection portion operably coupled to the overvoltage protection portion such that heat produced by the overcurrent protection portion at a current below a rated current of the overcurrent protection portion causes the overvoltage protection portion to change from a voltage regulation state to a shorted state.

24 Claims, 13 Drawing Sheets

(56) References Cited

U.S. PATENT DOCUMENTS

| | | |
|---|---|---|
| 6,331,763 B1 | 12/2001 | Thomas et al. |
| 6,489,879 B1 | 12/2002 | Singh et al. |
| 6,492,792 B1 | 12/2002 | Johnson, Jr. et al. |
| 6,521,483 B1* | 2/2003 | Hashimoto .................. 438/110 |
| 6,700,766 B2 | 3/2004 | Sato |
| 6,937,454 B2 | 8/2005 | Mikolajczak et al. |
| 7,031,130 B2 | 4/2006 | Simonelli et al. |
| 7,106,572 B1* | 9/2006 | Girard ........................ 361/118 |
| 7,660,096 B2* | 2/2010 | Golubovic et al. ........... 361/124 |
| 8,031,449 B2* | 10/2011 | Burns et al. ................. 361/90 |
| 2002/0024791 A1 | 2/2002 | Whitney et al. |
| 2002/0071233 A1* | 6/2002 | Bock et al. .................. 361/127 |
| 2005/0141161 A1 | 6/2005 | Usui |
| 2005/0225421 A1* | 10/2005 | Furuta et al. ................. 337/167 |
| 2005/0258805 A1* | 11/2005 | Thomas et al. ............... 320/134 |
| 2005/0275065 A1 | 12/2005 | Cogan et al. |
| 2006/0215342 A1 | 9/2006 | Montoya et al. |
| 2008/0130180 A1* | 6/2008 | de Palma et al. .............. 361/56 |
| 2009/0212937 A1* | 8/2009 | Stamer et al. ................ 340/506 |

OTHER PUBLICATIONS

NXP Semiconductors, "AN10910: Protecting charger interfaces and typical battery charging topologies with external bypass transistors", Application note, Rev. 01, Apr. 28, 2010, 17 pages.

"Tips for Enhancing ESD Protection", Littlefuse Indistries, Application Note, 2009, 4 pages.

\* cited by examiner

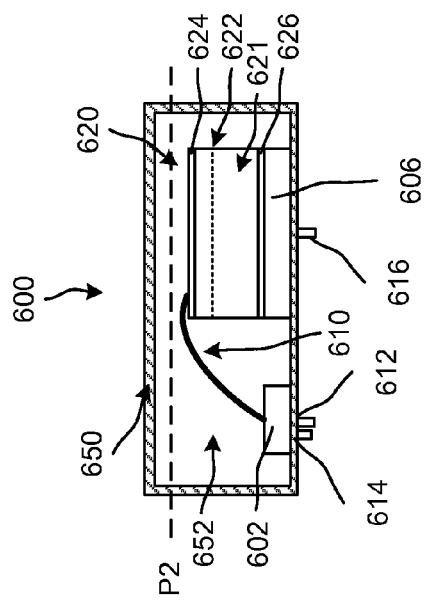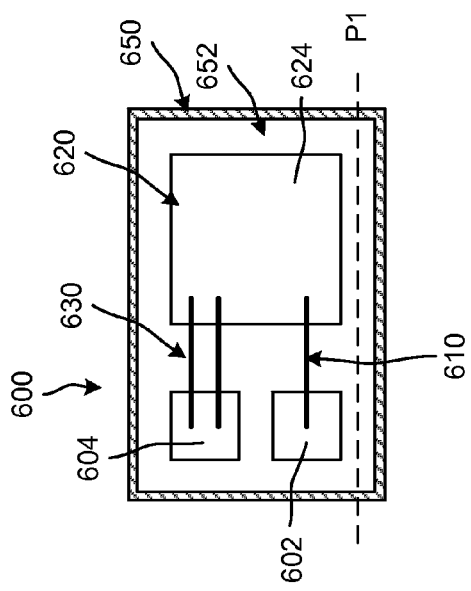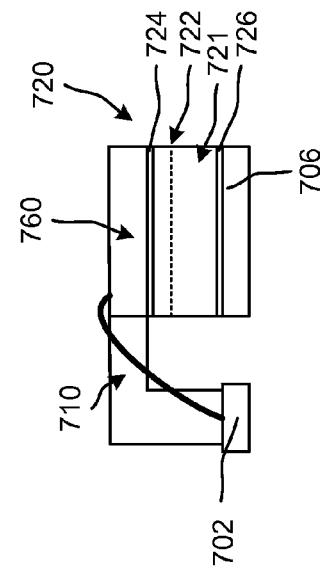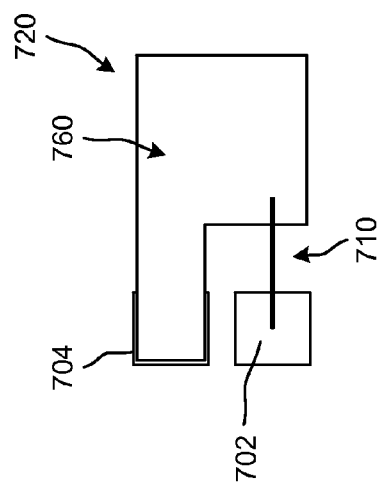

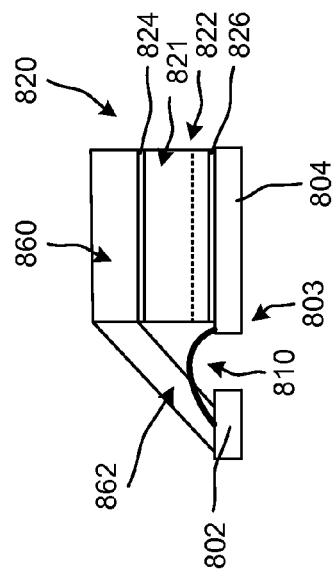
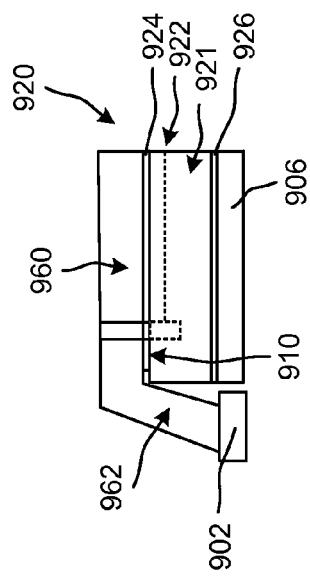
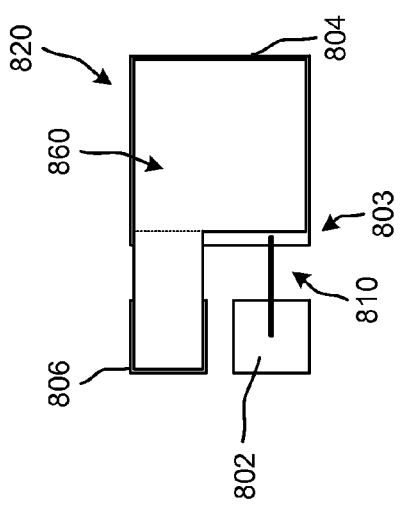
FIG. 8A
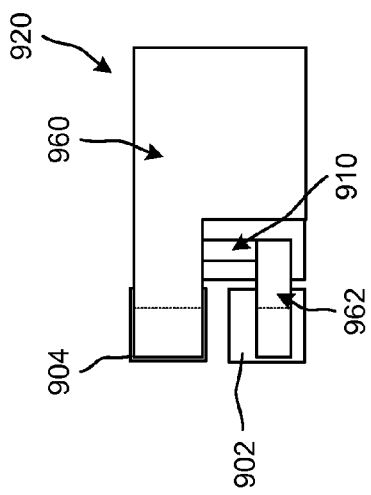
FIG. 9A

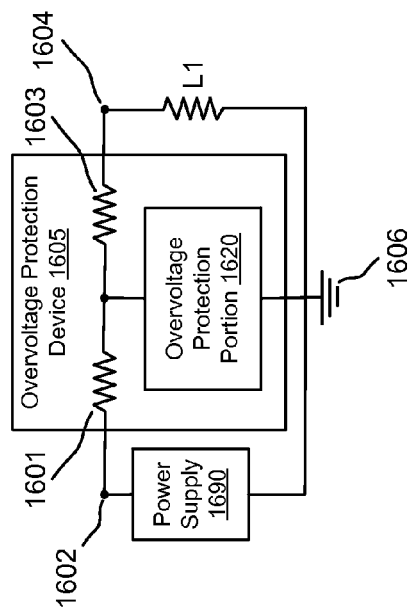
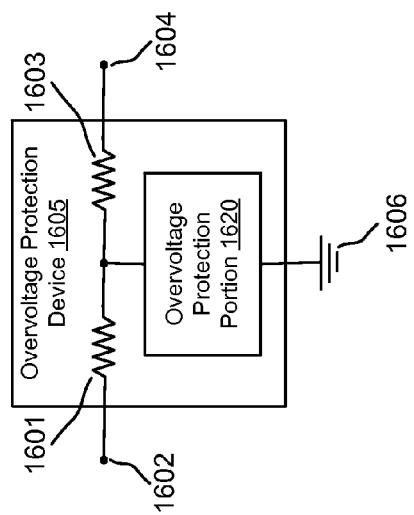
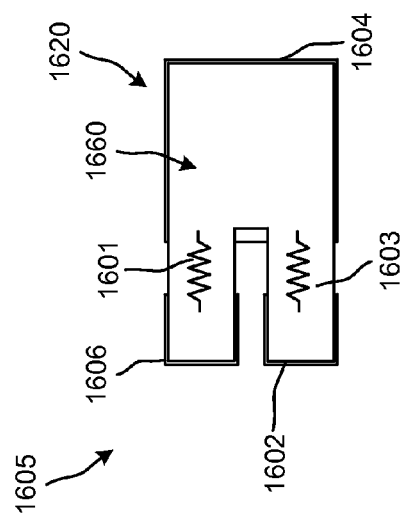
FIG. 16B
FIG. 16A
FIG. 16C

INPUT POWER PORT PROTECTION COMPONENT

RELATED APPLICATION

This application claims priority to and the benefit of U.S. Provisional Patent Application No. 61/416,567, filed Nov. 23, 2010, entitled, "Input Power Port Protection Component", the disclosure of which is incorporated by reference herein in its entirety.

TECHNICAL FIELD

This description relates to an input power port protection component.

BACKGROUND

Input power ports and/or related components can be protected from undesirable power conditions (e.g., overcurrent conditions and/or overvoltage conditions) using multiple discrete devices such as fuses and/or zener diodes. When the input power port is protected from undesirable power conditions using multiple discrete devices, unpredictable and/or unwanted interactions can occur between the discrete devices. For example, certain discrete devices selected for overvoltage protection of the input power port may not interact in a favorable fashion with other discrete devices selected for overcurrent protection of the input power port. Unmatched components can result in various irregular failure modes and/or damage to downstream components intended for protection at the input power port. Also, the complexity and cost of assembly of protection at an input power port may be increased in an unfavorable manner when multiple discrete components are used in conventional circuits used for input power port protection. Thus, a need exists for systems, methods, and apparatus to address the shortfalls of present technology and to provide other new and innovative features.

SUMMARY

In one general aspect, an apparatus can include an overvoltage protection portion, and an overcurrent protection portion operably coupled to the overvoltage protection portion such that heat produced by the overcurrent protection portion at a current below a rated current of the overcurrent protection portion causes the overvoltage protection portion to change from a voltage regulation state to a shorted state In another general aspect, an apparatus can include an overcurrent protection portion and an overvoltage protection portion coupled to the overcurrent protection portion such that a thermally triggered change from a voltage regulation state to a shorted state of the overvoltage protection portion triggers a low conduction state of the overcurrent protection portion.

In yet another general aspect, a method can include receiving an overvoltage protection portion having a substrate, and disposing the overvoltage protection portion into a container. The overvoltage protection portion can be electrically and thermally coupled to an overcurrent protection portion disposed within the container.

The details of one or more implementations are set forth in the accompanying drawings and the description below. Other features will be apparent from the description and drawings, and from the claims.

BRIEF DESCRIPTION OF THE DRAWINGS

FIG. 6A is a block diagram that illustrates a top cross-sectional view of an input power protection device.

FIG. 6B is a block diagram that illustrates a side cross-sectional view of the input power protection device shown in FIG. 6A.

FIG. 7A is a block diagram that illustrates a top view of components of an input power protection device.

FIG. 7B is a block diagram that illustrates a side view of the components of the input power protection device shown in FIG. 7A.

FIG. 8A is another block diagram that illustrates a top view of components of an input power protection device.

FIG. 8B is a block diagram that illustrates a side view of the components of the input power protection device shown in FIG. 8A.

FIG. 9A is yet another block diagram that illustrates a top view of components of an input power protection device.

FIG. 9B is a block diagram that illustrates a side view of the components of the input power protection device shown in FIG. 9A.

FIG. 16A is a schematic that illustrates a three-terminal overvoltage protection device that includes an overvoltage protection portion.

FIG. 16B is a schematic that illustrates an example of a power supply and a load coupled to the overvoltage protection device shown in FIG. 16A.

FIG. 16C is a block diagram that illustrates a top view of an implementation of the overvoltage protection device shown in FIG. 16A.

DETAILED DESCRIPTION

Figure 1:
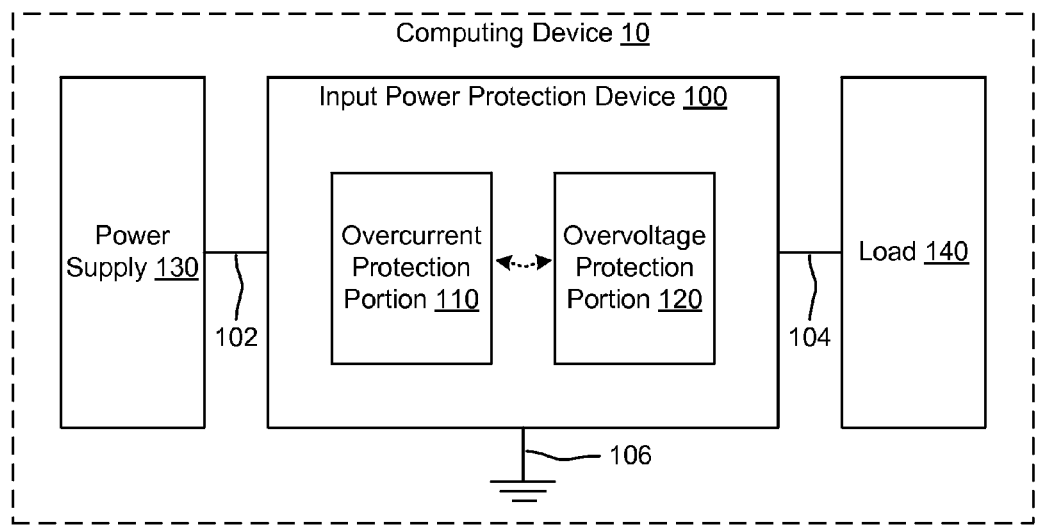
FIG. 1 is a block diagram that illustrates an input power protection device.

FIG. 1 is a block diagram that illustrates an input power protection device 100. As shown in FIG. 1, the input power protection device 100 includes an overcurrent protection portion 110 and an overvoltage protection portion 120. In some embodiments, the overcurrent protection portion 110 and the overvoltage protection portion 120 can collectively be referred to as components of the input power protection device 100.

The input power protection device 100 is configured to provide power protection to a load 140 from one or more undesirable power conditions. In some embodiments, the undesirable power conditions (which can include an overvoltage condition and/or an overcurrent condition) such as a voltage spike (related to power supply noise) and/or a current spike (caused by a downstream overcurrent event such as a short) may be produced by the power supply 130. For example, the load 140 may include electronic components (e.g., sensors, transistors, microprocessors, application-specific integrated circuits (ASICs), discrete components, circuit board) that could be damaged in an undesirable fashion by relatively fast increases in current and/or voltage produced by the power supply 130. Accordingly, the input power protection device 100 can be configured to detect and prevent these relatively fast increases in current and/or voltage from damaging the load 140 and/or other components associated with the load 140 (such as a circuit board).

In some embodiments, the overcurrent protection portion 110 and the overvoltage protection portion 120 can be included in the input power protection device 100 so that the overcurrent protection portion 110 provides series overcurrent protection and the overvoltage protection portion 120 provides shunt to ground overvoltage protection. The series overcurrent protection provided by the overcurrent protection portion 110 and the shunt to ground overvoltage protection provided by the overvoltage protection portion 120 can be integrated into a single package of the input power protection device 100 so that the input power protection device 100 is a standalone, discrete component.

The overvoltage protection portion 120 of the input power protection device 100 can be configured to protect the load 140 from, for example, sudden or sustained increases in voltage produced by the power supply 130. In other words, the overvoltage protection portion 120 of the input power protection device 100 can be configured to provide voltage protection to the load 140 in response to, for example, an overvoltage event. In some embodiments, the overvoltage protection portion 120 of the input power protection device 100 can be configured to protect the load 140 from voltage produced by the power supply 130 based on one or more voltage conditions (e.g., a voltage level sustained over a specified period of time, a voltage exceeding a threshold voltage).

In some embodiments, the overvoltage protection portion 120 can be configured to change conduction state from a voltage regulation state to a shorted state (e.g., a high conduction/low resistance state). When in the voltage regulation state, the overvoltage protection portion 120 can be configured to limit (e.g., clamp) a voltage across the overvoltage protection device (and a downstream load) at a threshold voltage (e.g., a voltage limit, a clamping voltage). For example, if the overvoltage protection portion is, or includes, a zener diode, the zener diode can be configured to limit a voltage across the zener diode at a zener breakdown voltage when in the voltage regulation state. When in the shorted state, the overvoltage protection portion 120 may be in a thermally induced shorted state. In some embodiments, the shorted state can be a failure mode of the device where a physical change in the structure of the overvoltage protection device causes the shorting. In other words, the overvoltage protection portion 120 can be configured to change from the voltage regulation state to the shorted state in response to a temperature of the overvoltage protection portion 120 increasing beyond a threshold temperature. For example, if the overvoltage protection portion 120 is a zener diode, migration of metals across a PN junction of the zener diode in response to a temperature above a threshold temperature BT of the zener diode can result in a short within the zener diode (e.g., across the PN junction).

In some embodiments, once the overvoltage protection portion 120 has changed to the shorted state, the overvoltage protection portion 120 may not change back to the voltage regulation state. In other words, a change to the shorted state from the voltage regulation state can be an irreversible change (e.g., physical change). In some embodiments, the overvoltage protection portion 120 can be, or can include, a device configured to reversibly change from the shorted state back to the voltage regulation state.

Accordingly, a voltage output from the power supply 130 (and across the overvoltage protection portion 120) can be changed when the voltage output exceeds a threshold voltage while the overvoltage protection portion 120 is in the voltage regulation state, or if the temperature of the overvoltage protection portion 120 exceeds a threshold temperature and the overvoltage protection portion 120 changes to the shorted state. For example, the overvoltage protection portion 120 can be configured to limit a voltage from the power supply 130 (and across the overvoltage protection portion 120) when the voltage output exceeds a threshold voltage (while the overvoltage protection portion 120 is in a voltage regulation state). In some embodiments, after an overvoltage condition has ended, the voltage will no longer be limited by the overvoltage protection portion 120 (because the voltage across the overvoltage protection portion 120 will be below the threshold voltage). As another example, the overvoltage protection portion 120 can be configured to cause a short that limits a voltage output from the power supply 130 (and across the overvoltage protection portion 120) when the voltage output exceeds a threshold temperature and the overvoltage protection portion 120 changes to the shorted state. In some embodiments, the overvoltage protection portion 120 can be referred to as changing to a high conduction state or as failing short when limiting the voltage output from the power supply 130 when changing to the shorted state.

In some embodiments, the overvoltage protection portion 120 of the input power protection device 100 can be, or can include, for example, any type of transient voltage suppressor (TVS) (also can be referred to as a transient voltage suppression device). In some embodiments, the overvoltage protection portion 120 of the input power protection device 100 can be, or can include, for example, any type of device configured to change between a voltage regulation state (in response to voltage changes) and a shorted state (in response to temperature changes). In some embodiments, the overvoltage protection portion 120 can be configured to reversibly or irreversibly change between the voltage regulation state and the shorted state. In some embodiments, the overvoltage protection portion 120 of the input power protection device 100 can include one or more zener diodes, one or more metal oxide varistors, and/or so forth.

The overcurrent protection portion 110 of the input power protection device 100 can be configured to protect the load 140 from, for example, sudden or sustained increases in current produced by the power supply 130. In other words, the overcurrent protection portion 110 of the input power protection device 100 can be configured to provide current protection to the load 140 in response to, for example, an overcurrent event. In some embodiments, the overcurrent protection portion 110 of the input power protection device 100 can be configured to protect the load 140 from current produced by the power supply 130 based on one or more current conditions (e.g., a current level sustained over a specified period of time, a current exceeding a threshold voltage, a short high current pulse). In some embodiments, the overcurrent protection portion 110 can be configured to cause a change in a conduction state from a high conduction state (e.g., a low resistive state) to a low conduction state (e.g., a high resistance state that prevents or limits (significantly limits) current from flowing to the load 140 when a current output from the power supply 130 (and through the overcurrent protection portion 110) exceeds a threshold current (within or for a specified period of time). For example, the overcurrent protection portion 110 can be configured to cause to cause an open circuit (e.g., melt to produce an open circuit, blow open to produce an open circuit) that prevents current from flowing to the load 140 when a current output from the power supply 130 (and through the overcurrent protection portion 110) exceeds a threshold current (within a specified period of time). In some embodiments, the overcurrent protection portion 110 can be referred to as failing open when limiting the current output from the power supply 130 as described. In some embodiments, after an overcurrent condition has ended, the overcurrent protection portion 110 can be configured to change conduction state from the low conduction state (e.g., the high resistance state) to the high conduction state (e.g., the low resistance state).

In some embodiments, the overcurrent protection portion 110 of the input power protection device 100 can be, or can include, any type of overcurrent protection device. In some embodiments, the overcurrent protection portion 110 of the input power protection device 100 can be, or can include, for example, any type of device configured to change between conduction states (e.g., from the high conduction state to the low conduction state). In other words, the overcurrent protection portion 110 can include any type of current sensitive switch device that responds to increased current draw by switching to a low conduction state (e.g., a high resistance state). In some embodiments, the overcurrent protection portion 110 of the input power protection device 100 can be, or can include, for example, a fuse, a silicon current limit switch, a polysilicon-based fuse, an electronic fuse (e-fuse), a polymer positive temperature coefficient (PPTC) device, a ceramic positive temperature coefficient (CPTC) device, and/or so forth. In some embodiments, the input power protection device 100 can be referred to as a fusing diode.

In this embodiment, the overcurrent protection portion 110 and the overvoltage protection portion 120 are integrated into the input power protection device 100 so that the input power protection device 100 is a single integrated component (e.g., single discrete component). In other words, the input power protection device 100 is a single integrated component that includes both the overcurrent protection portion 110 and the overvoltage protection portion 120. Specifically, the overcurrent protection portion 110 and the overvoltage protection portion 120 are integrated into a single package of the input power protection device 100 with three terminals—an input terminal 102, an output terminal 104, and a ground terminal 106 (which can collectively be referred to as terminals). In some embodiments, the terminals can be referred to as ports, pins, portions, and/or so forth (e.g., input port 102 can be referred to input pin 102 or as input portion 102). Examples of physical characteristics of input power protection devices that are discrete components with both an overvoltage protection portion and an overcurrent protection portion are described in connection with FIGS. 6A through 9B.

As shown in FIG. 1, the input power protection device 100, the power supply 130, and the load 140 can be included in (e.g., integrated into) a computing device 10. In some embodiments, the computing device 10 can be, for example, a computer, a personal digital assistant (PDA), a host computer, an electronic measurement device, a data analysis device, a cell phone, an electronic device, and/or so forth.

Because the overcurrent protection portion 110 and the overvoltage protection portion 120 are integrated into a single component, assembly can be simplified and can result in reduced production costs. In some embodiments, the overcurrent protection portion 110 and the overvoltage protection portion 120 are integrated into a single component (i.e., the input power protection device 100) so that installation of a separate overcurrent protection device and overvoltage protection device into a computing device (e.g., such as computing device 10) may not be necessary. Instead, overcurrent protection and overvoltage protection can be provided by the input power protection device 100, which includes both the overcurrent protection portion 110 and the overvoltage protection portion 120. In some embodiments, circuit board space can be more efficiently allocated by using the input power protection device 100, which is a single component, than if overcurrent protection and overvoltage protection were achieved using multiple separate components.

In some embodiments, because the overcurrent protection portion 110 and the overvoltage protection portion 120 are integrated into the input power protection device 100, the overcurrent protection portion 110 and the overvoltage protection portion 120 can be configured to interoperate (e.g., can be matched) in a desirable fashion. Specifically, the overcurrent detection portion 110 and the overvoltage protection portion 120 can be configured (e.g., sized) so that the overvoltage conditions and the overcurrent conditions collectively operate in a desirable fashion. For example, the overvoltage protection portion 120 can be configured so that the overvoltage protection portion 120 may not cause the overcurrent protection portion 110 to, for example, prematurely change to a low conduction state (e.g., change to high resistance state, fail open, blow open, melt to produce an open circuit). If not properly matched, an overvoltage protection device can change to a shorted state (e.g., fail short, produce a short circuit) and can cause an overcurrent protection device (which is separate from the overvoltage protection device) to change to a low conduction state (e.g., fail open) at a fault condition, that without overvoltage protection portion change in state, would have kept the current below a threshold current of the overcurrent protection device.

In some embodiments, integration of the overcurrent protection portion 110 and the overvoltage protection portion 120 into a single, discrete component can result in a reduced risk of undesirable overvoltage protection portion 120 open failure modes (which can then result in undesirable damage to the load 140 and/or a fire). For example, if the overvoltage protection portion 120 is not properly matched to the overcurrent protection portion 110, the overvoltage protection portion 120 (rather than the overcurrent protection portion 110) may fail open and, consequently, a voltage across the load 140 may not be appropriately limited.

As described above, the overcurrent protection portion 110 and the overvoltage protection portion 120 can each be configured to independently provide power protection. For example, the overcurrent protection portion 110 can be configured to provide overcurrent protection in response to an overcurrent event, and the overvoltage protection portion 120 can be configured to provide overvoltage protection in response to an overvoltage event. In some embodiments, because the overcurrent protection portion 110 and the overvoltage protection portion 120 are integrated into the input power protection device 100, thermal coupling (represented by the dashed double-sided arrow) between the overcurrent protection portion 110 and the overvoltage protection portion 120 can also be used to provide power protection (e.g., overcurrent protection, overvoltage protection) to the load 140. Specifically, the thermal coupling can be a mechanism through which the overcurrent protection portion 110 and the overvoltage protection portion 120 can interact (e.g., interoperate) to provide power protection to the load 140. In some embodiments, such thermal coupling may not be possible if the overcurrent protection portion 110 and the overvoltage protection portion 120 are not integrated as a single component in the input power protection device 100.

For example, heat produced by the overcurrent protection portion 110, while drawing an undesirable level of current, can be transferred to the overvoltage protection portion 120. The heat transferred to the overvoltage protection portion 120 can cause the overvoltage protection portion 120 to change from a voltage regulation state to a shorted state (e.g., fail short, low resistivity state) and thereby increase draw current through the overcurrent protection portion 110. The current drawn through the overcurrent protection portion 110, in response to the current drawn through the overvoltage protection portion 120, can cause the overcurrent protection portion 110 to change to a low conduction state (e.g., fail open, a high resistivity state) and protect the load 140 from an undesirable level of current and limit the heat that the overcurrent protection portion 110 can transfer to a board (e.g., a PCB). Thus, when the overvoltage protection portion 120 is thermally coupled to the overcurrent protection portion 110, the overcurrent protection portion 110 can be configured to heat the overvoltage protection portion 120 to its critical thermal break down temp (which can be, by design, lower than the overcurrent protection portion 110 element open temp), the overvoltage protection portion 120 will changed to a shorted state, pull more current through the overcurrent protection portion 110, and cause the overcurrent protection portion 110 to change to a low conductions state. In some thermally decoupled systems using multiple separate components, relatively low currents near the threshold current (e.g., rated current, open current) of the overcurrent protection portion 110 can increase the overcurrent protection portion 110 temperature and related board temperature to dangerous (e.g., damaging) levels, without causing the overcurrent protection portion 110 to change to a low conduction state. If the overcurrent protection portion 110 is, or includes, a fuse, the fuse can achieve very high temperature when running near the threshold current—this can result in a board fire in some systems.

In some embodiments, the power supply 130 can be any type of power supply such as, for example, a switched mode power supply, a direct-current (DC) power supply, an alternating-current (AC) power supply, and/or so forth. In some embodiments, the power supply 130 can include a power source that can be any type of power source such as, for example, a direct current (DC) power source such as a battery, a fuel cell, and/or so forth.

Figure 2:
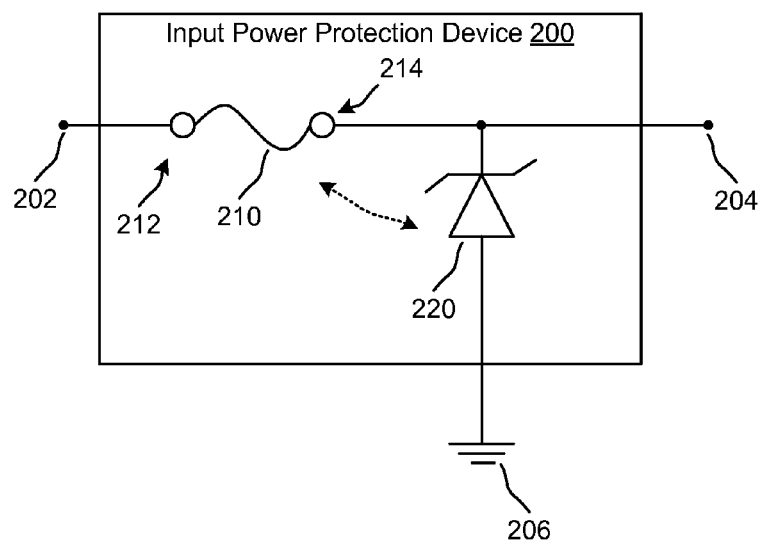
FIG. 2 is a schematic of an input power protection device.

FIG. 2 is a schematic of an input power protection device 200. As shown in FIG. 2, the input power protection device 200 includes a fuse 210 (also can be referred to as a fuse device), which functions as an overcurrent protection portion of the input power protection device 200. In some embodiments, the fuse 210 can be formed of any type of material (or combination thereof) such as, for example, aluminum, tin, copper, lead, brass, bronze, nichrome, and/or so forth. The input power protection device 200 also includes a zener diode 220 (which can be a type of TVS diode) (which will be generally referred to as a zener diode device), which functions as an overvoltage protection portion of the input power protection device 200. In some embodiments, the zener diode 220 can be a semiconductor device formed using a PN junction (which is formed with or associated with a p-type semiconductor and an n-type semiconductor) in any type of semiconductor materials such as, for example, silicon (e.g., a doped silicon), gallium arsenide, germanium, silicon carbide, and/or so forth.

In some embodiments, the zener diode 220 can include a silicon substrate 150 that includes (or is associated with) at least a portion of a PN junction. In some embodiments, the PN junction can be produced in a single or multiple crystals of semiconductor, for example, by doping, using ion implantation, diffusion of dopants, epitaxial growth, and/or so forth. Although this embodiment, and many of the embodiments described herein, are discussed in the context of a zener diode, any type of overvoltage protection portion may be used with, or instead of, the zener diode. For example, the overvoltage protection portion of the input power protection device 200 could be any type of TVS device.

As shown in FIG. 2, the fuse 210 and the zener diode 220 are integrated into the input power protection device 200 so that the input power protection device 200 functions as a single integrated component. In other words, the fuse 210 and the zener diode 220 can be packaged into the input power protection device 200 so that the input power protection device 200 functions as a standalone discrete component.

Because the fuse 210 and the zener diode 220 are integrated into the input power protection device 200, the input power protection device 200 includes three terminals. When each functioning as standalone components, a fuse is typically packaged as a two-terminal device and a zener diode is also typically packaged as a two-terminal device. As shown in FIG. 2, the three terminals of the input power protection device 200 are an input terminal 202, an output terminal 204, and a ground terminal 206. As shown in FIG. 2, the input terminal 202 is coupled to (e.g., electrically coupled to) an end 212 of the fuse 210. The zener diode 220 is coupled to (e.g., electrically coupled to) end 214 of the fuse 210, which is also coupled to (e.g., electrically coupled to) the output terminal 204. Thus, the end 214 of fuse 210 and the zener diode 220 are both coupled to the output terminal 204 and function as a single node. The zener diode 220 is also coupled to the ground terminal 206.

Because the input power protection device 200 includes a three terminal architecture, the fuse 210 can fail open (also can be referred to as blowing open) and interrupt current to both the zener diode 220 and a downstream system (e.g., a load) coupled to the input power protection device 200 via the output terminal 204. In some embodiments, the fuse 210 can fail open when the fuse 210 melts to produce an open circuit. In some embodiments, the fuse 210 can fail open in response to a downstream overcurrent event, an overvoltage event, and/or a thermally coupling mechanism. Examples of these different power protection mechanisms of an input power protection device that includes an overcurrent protection portion (e.g., a fuse device) and an overvoltage protection portion (e.g., a zener diode) are illustrated in the graphs shown in FIGS. 3A through 5B.

Figure 4A:
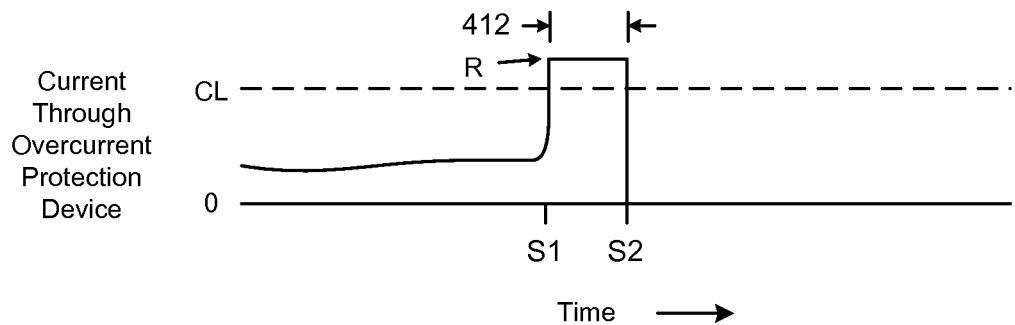
FIGS. 4A through 4C are graphs that illustrate power protection provided by an input power protection device in response to an overcurrent event.
Figure 4B:
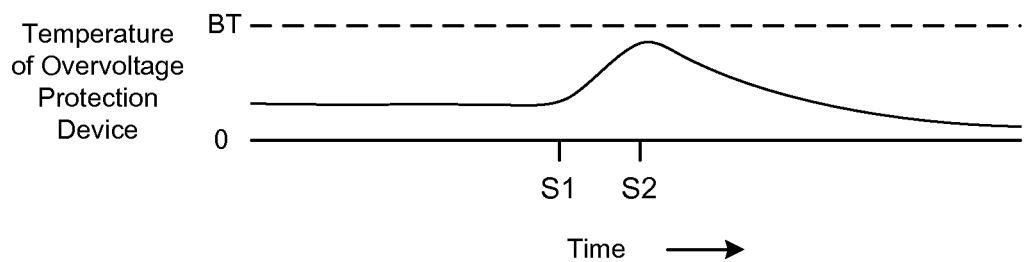
Figure 4C:
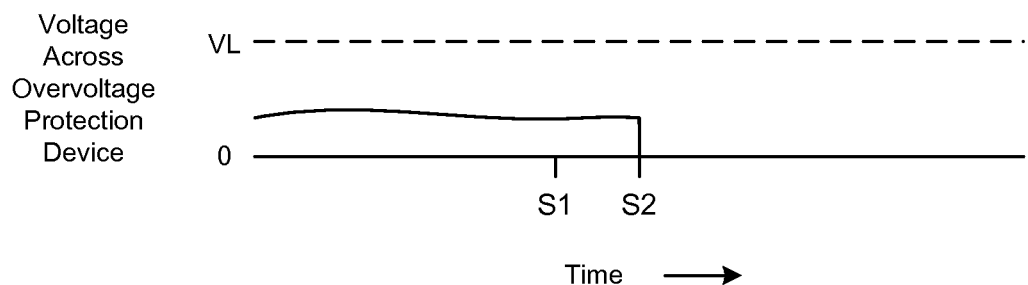
Figure 5A:
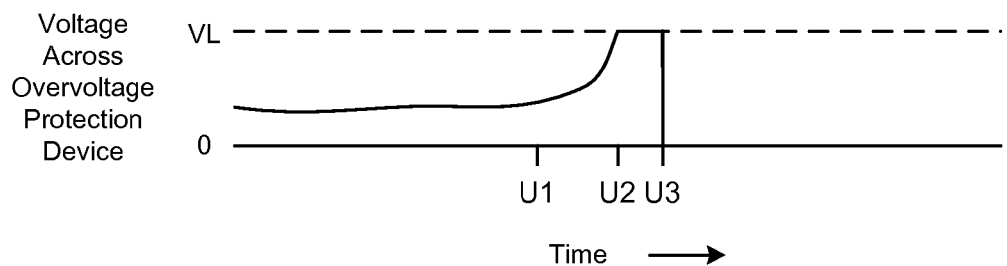
FIGS. 5A and 5C are graphs that illustrate power protection provided by an input power protection device in response to an overvoltage event.
Figure 5B:
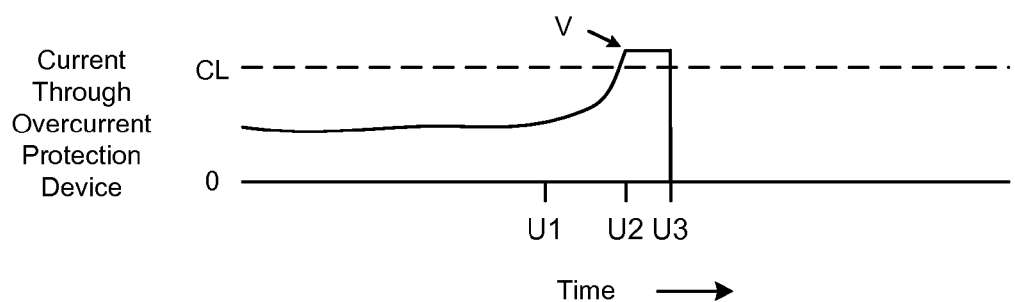

Specifically, FIGS. 3A through 3D are graphs that illustrate power protection provided by an input power protection device (such as those shown in FIGS. 1 and 2) via a thermal coupling mechanism. FIGS. 4A through 4C are graphs that illustrate power protection provided by an input power protection device in response to an overcurrent event. FIGS. 5A and 5B are graphs that illustrate power protection provided by an input power protection device in response to an overvoltage event.

Although the behavior of the components described in connection with FIGS. 3A through 5B are described as, for example, making transitions at specified voltages, currents, and/or at specified times, when implemented (e.g., implemented using semiconductor devices), the transitions of the components may occur slightly before or slightly after the specified voltages, currents, and/or specified times. Specifically, variations in breakdown voltages, thermal conductivity, processing variations, temperature variations, switching times of devices, circuit transition delays, and/or so forth can result in conditions (e.g., non-ideal conditions) that can trigger transitions of components slightly before or slightly after the voltages, currents, and/or times in FIGS. 3A through 5B. As shown in FIGS. 3A through 5B, time is increasing to the right.

Figure 3A:
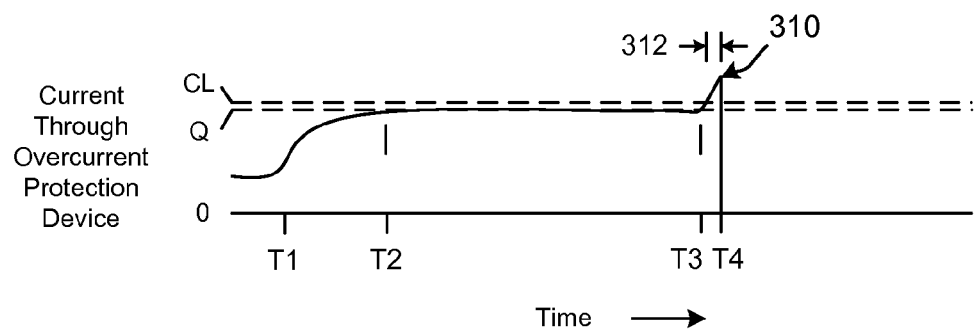
FIGS. 3A through 3D are graphs that illustrate power protection provided by an input power protection device via a thermal coupling mechanism.

FIG. 3A is a graph that illustrates a current through an overcurrent protection device included in an input power protection device. The overcurrent protection device can be a fuse device such as fuse 210 of the input power protection device 200 shown in FIG. 2. In some embodiments, the overcurrent protection device can be included in, or can be, an overcurrent protection portion 110 of the input power protection device 100 shown in FIG. 1.

As shown in FIG. 3A, current through the overcurrent protection device increases starting at approximately time T1 until the current is at current Q, which is below the threshold current CL, at approximately time T2. The current through the overcurrent protection device is approximately at current Q between times T2 and T3. In some embodiments, the threshold current CL can represent a rated current of the overcurrent protection device, which can be approximately the maximum current at which the overcurrent protection device can continuously conduct current without failing open (e.g., blowing open). In other words, the threshold current CL can represent the current at which the overcurrent protection device can continuously conduct current without interrupting current flow to a downstream load (e.g., circuit). In some embodiments, the threshold current CL can represent the minimum steady-state current at which the overcurrent protection device changes from a high conduction state to a low conduction state (e.g., fails open). In some embodiments, threshold current CL can be, for example, between microamps and amps. For example, the threshold current CL can be 2 microamps, 5 milliamps, 10 amps, 100 amps, and so forth.

Figure 3B:
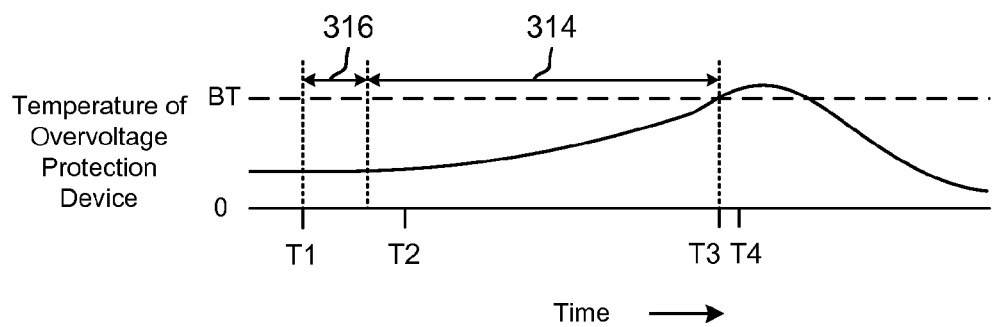
Figure 3C:
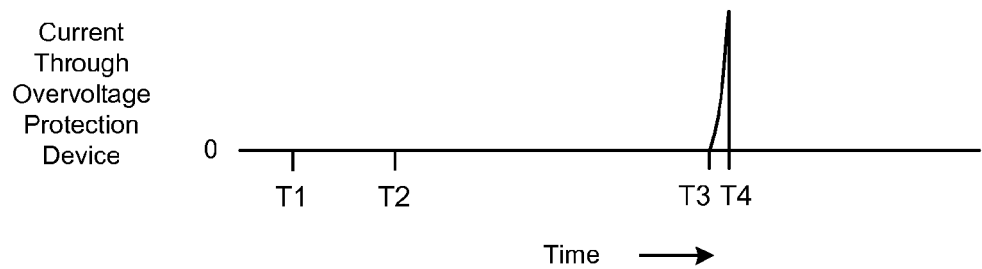
Figure 3D:
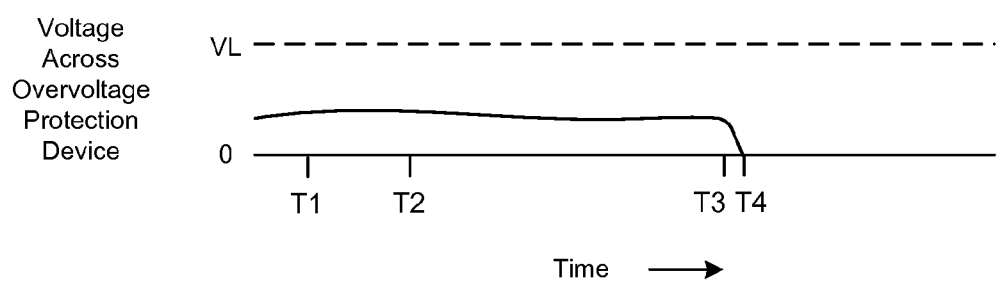

FIG. 3B is a graph that illustrates a temperature of an overvoltage protection device (e.g., a transient voltage suppression (TVS) device) integrated into the input power protection device with the overcurrent protection device described in connection with FIG. 3A. FIG. 3C is a graph that illustrates a current through the overvoltage protection device, and FIG. 3D is a graph that illustrates a voltage across the overvoltage protection device. The overvoltage protection device can be, for example, a zener diode such as zener diode 220 of the input power protection device 200 shown in FIG. 2. In some embodiments, the overvoltage protection device can be included in, or can be, an overvoltage protection portion 120 of the input power protection device 100 shown in FIG. 1.

As shown in FIG. 3B, in response to the current through the overcurrent protection device increasing to current Q (shown in FIG. 3A), the temperature of the overvoltage protection device starts increasing between times T1 and T2. Specifically, the temperature of the overvoltage protection device can start increasing between times T1 and T2 in response to heat produced by the overcurrent protection device in response to the current through the overcurrent protection device. The heat can be thermally conducted through, for example, packaging (e.g., molding) that is used to integrate (or package) the overcurrent protection device and the overvoltage protection device into the input power protection device, or other device structure.

In this embodiment, the overvoltage protection device is configured to change from a voltage regulation state to a shorted state (e.g., fail short) when the temperature of the overvoltage protection device reaches a threshold temperature BT. In some embodiments, the threshold temperature BT can be referred to as a threshold breakdown temperature, or as a critical breakdown temperature—this shorting state can be achieved even if voltage threshold VL is not exceeded. When in the voltage regulation state, the overvoltage protection device can be configured to limit a voltage across of the overvoltage protection device (and a downstream load). For example, if the overvoltage protection device is a zener diode, the zener diode can be configured to limit a voltage across the zener diode at a Zener breakdown voltage when in the voltage regulation state. The voltage regulation limit of the overvoltage protection device is shown in FIG. 3D as voltage threshold VL (also can be referred to as a reverse breakdown voltage or as a clamping voltage).

When in the shorted state, the overvoltage protection device can become shorted and can then be configured to conductively draw a current. When in the shorted state, the overvoltage protection device may be in a thermally induced shorted state that can be a failure mode of the device where a physical change in the structure of the overvoltage protection device causes the shorting. For example, if the overvoltage protection device is a zener diode, migration of metals across a PN junction of the zener diode in response to a temperature above the threshold temperature BT can result in a short within the zener diode (e.g., across the PN junction). In some embodiments, once the overvoltage protection device has changed to the shorted state, the overvoltage protection device may not change back to the voltage regulation state. In other words, a change to the shorted state can be an irreversible physical change. In some embodiments, the overvoltage protection device can be, or can include, a device configured to reversibly change from the shorted state back to the voltage regulation state.

As shown in FIG. 3B, the temperature of the overvoltage protection device reaches the threshold temperature BT at time T3, at which time, the overvoltage protection device fails short (changes to the shorted state). In some embodiments, the threshold temperature BT can be between, for example, 200 and 700 degrees Fahrenheit (e.g., 350 degrees Fahrenheit, 400 degrees Fahrenheit, 450 degrees Fahrenheit). In some embodiments, the overvoltage protection device can be configured so that the threshold temperature BT is higher or lower than that shown in FIG. 3B. In some embodiments, the overvoltage protection device can be made of material (e.g., semiconductor material) that intrinsically has a specified threshold temperature BT. In some embodiments, the overvoltage protection device can be configured so that a thermal conductivity coupling of the overvoltage protection device results in a time shorter or longer than that shown in FIG. 3B.

In response to the overvoltage protection device changing from the voltage regulation state to the shorted state (e.g., failing short), current drawn through the through the overvoltage protection device rapidly increases as shown in FIG. 3C. Specifically, current through the overvoltage protection device rapidly increases starting at time T3, which is approximately the time at which the overvoltage protection device changes to the shorted state (e.g., fails short).

Also, in response to the overvoltage protection device changing to a shorted state (e.g., failing short), current drawn through the overcurrent protection device increases starting at time T3 as shown in FIG. 3A. The current drawn through overcurrent protection device increases as the current drawn through the overvoltage protection device increases. The current drawn through overcurrent protection device can increase in response to the current drawn through the overvoltage protection device increasing. As shown in FIG. 3A, the current from the overcurrent protection device increases from current Q starting at time T3 to a peak current 310 beyond the threshold current CL (for simplicity the associated time component of CL is not discussed). In response to the current through the overcurrent protection device increasing beyond the threshold current CL, the overcurrent protection device changes to a low conduction state (e.g., fails open) at time T4. When the overcurrent protection device changes to the low conduction state (e.g., fails open) at time T4, the current through the overcurrent protection device decreases to zero (or a relatively low value) (because the overcurrent protection device has changed to a low conduction state (e.g., failed open)).

As shown in FIG. 3A, the overcurrent protection device changes to the low conduction state (e.g., fails open) after the current through the overcurrent protection device is above the threshold current CL during time period 312. In some embodiments, the overcurrent protection device may change to the low conduction state (e.g., fail open) when a temperature of the overcurrent protection device causes at least a portion of the overcurrent protection device to, for example, melt in response to current flowing through the overcurrent protection device. Thus, the time period during which the overcurrent protection device changes to the low conduction state (e.g., fails open) can depend on the level of current flowing through the overcurrent protection device, a size of the overcurrent protection device, a thermal conductivity of the overcurrent protection device, a resistivity of the overcurrent protection device, and/or so forth. In some embodiments, the overcurrent protection device can be configured so that the overcurrent protection device changes to the low conduction state (e.g., fails open) after the current to the overcurrent protection devices of the threshold current CL during a time period shorter than time period 312, or during a time period longer than time period 312.

As shown in FIG. 3C, the current through the overvoltage protection device drops to zero (or a relatively low value) at time T4 in response to the overcurrent protection device changing to the low conduction state (e.g., failing open) at time T4 (as shown in FIG. 3A). In some embodiments, the current through the overvoltage protection device before time T3 can be greater than zero. In some embodiments, the current through the overvoltage protection device before time T3 can be a relatively small current. In some embodiments, the current through the overvoltage protection device before time T3 can be approximately a leakage current through the overvoltage protection device.

As shown in FIG. 3D, the voltage across the overvoltage protection device is approximately constant during operation of the input power protection device until the overcurrent protection device starts changing to the low conductivity state (e.g., fails open) starting at time T3 (as shown in FIG. 3A). In response to the overcurrent protection device changing to the low conductivity state (e.g., failing open), the voltage across the overvoltage protection device drops to zero (or a relatively low value). In some embodiments, the failure of the overvoltage protection device in response to the temperature increase beyond the threshold temperature BT can be referred to as crowbar failure. As shown in FIG. 3D, the voltage across the overvoltage protection device is below a threshold voltage VL of the overvoltage protection device. The threshold voltage VL of the overvoltage protection device can be a voltage (e.g., a voltage regulation limit, a clamping voltage) at which the overvoltage protection device breaks down (e.g., break down voltage of a zener diode or zener voltage) when the overvoltage protection device is in the voltage regulation state. The breakdown of the overvoltage protection device at or above the threshold voltage VL can be a controlled breakdown (and a reversible breakdown), which is contrasted with the temperature induced breakdown when the overvoltage protection device changes to the shorted state. In some embodiments, the voltage across the overvoltage protection device can vary (e.g., increase, decrease) during operation of the input power protection device. In some embodiments, threshold voltage VL can be, for example, between millivolts and volts. For example, the threshold voltage VL can be 0.5 volts, 1.5 volts, 5 volts, 50 volts, and so forth.

As shown in FIG. 3B, the temperature of the overvoltage protection device begins to decrease after the overcurrent protection device changes to the low conduction state (e.g., fails open) at time T4. In some embodiments, the temperature of the overvoltage protection device can decrease because current is relatively limited or no longer flowing through the overcurrent protection device (or through any portion of the input power protection device). In some embodiments, the temperature of the overvoltage protection device can decrease as the overvoltage protection device cools via thermal cooling mechanisms such as convection, conduction, and/or so forth. In some embodiments, despite the cooling of the overvoltage protection device, the overvoltage protection device can remain in the shorted state.

In this embodiment, the temperature of the overvoltage protection device increases in temperature until the temperature of the overvoltage protection device reaches the threshold temperature BT in response to the increasing current to the overcurrent protection device (shown in FIG. 3A) during time period 314 (shown in FIG. 3B). Also, as shown in FIGS. 3A and 3B, the temperature the overvoltage protection device starts increasing between times T1 and T2 even though the current through the overcurrent protection device starts to increase at time T1. In other words, increase in the temperature of the overvoltage protection device is delayed relative to the increase in current through the overcurrent protection device. This delay is shown in FIG. 3B as delay time period 316.

In some embodiments, the overvoltage protection device (e.g., thermal conductivity of the overvoltage protection device) can be configured so that the overvoltage protection device reaches the threshold temperature BT during a time period shorter or longer than time period 314 shown in FIG. 3B. In some embodiments, the overvoltage protection device can be configured so that the delay time period 316 is shorter or longer than that shown in FIG. 3B. In some embodiments, a distance between the overvoltage protection device and the overcurrent protection device (which are integrated into the input power protection device) and/or a material between the overvoltage protection device the overcurrent protection device can be defined so that the delay time period 316 is shorter or longer than that shown in FIG. 3B and/or so that the overvoltage protection device reaches threshold temperature BT during a time period shorter or longer than the time period 314 shown in FIG. 3B. In some embodiments, the material between the overvoltage protection device and overcurrent protection device can be configured so that the material is a thermally conductive material (e.g., is a material that has a specified thermal conductivity) and/or an electrically insulating material such as, for example, silicon oxides, intrinsic semiconductors, polysilicon, polymer packaging glass, and/or so forth.

Although not shown in FIGS. 3A through 3D, in some embodiments, an increased leakage current (which can be temperature-induced) through the overvoltage protection device could cause the overcurrent protection device to fail open. For example, an increase in the temperature of the overvoltage protection device could cause the overvoltage protection device to draw a relatively high leakage current through the overvoltage protection device and through the overcurrent protection device. Even though the overvoltage protection device may not have failed short, the relatively high leakage current drawn through the overcurrent protection device by the overvoltage protection device (plus any additional current already flowing through the overcurrent protection device) could cause the overcurrent protection device to fail open (within a period of time).

As illustrated by the graphs shown in FIGS. 4A and 4C, change in conduction state (e.g., blowing open) of the overcurrent protection device can be caused by a chain events starting with a current flow (e.g., a sustained current flow) through the overcurrent protection device below the threshold current CL. Specifically, the change in conduction state of the overcurrent protection is caused by a positive feedback loop involving heat conduction (or heat transfer) between the overcurrent protection device and the overvoltage protection device. Current drawn through the overcurrent protection device results in heat transfer to the overvoltage protection device. As heat is transferred to the overvoltage protection device, the overvoltage protection causes a higher level of current to be drawn through the overcurrent protection device until the overcurrent protection device change in to the low conduction state (e.g., fails open).

FIG. 4A is a graph that illustrates a current through a overcurrent protection device included in an input power protection device. The overcurrent protection device can be a overcurrent protection device such as fuse 210 of the input power protection device 200 shown in FIG. 2. In some embodiments, the overcurrent protection device can be included in, or can be, an overcurrent protection portion 110 of the input power protection device 100 shown in FIG. 1.

As shown in FIG. 4A, current through the overcurrent protection device increases rapidly starting at approximately time S1 until the current is at current R, which is above the threshold current CL. The current through the overcurrent protection device can increase rapidly in response to an overcurrent event such as a change in conduction state (e.g., a short within a load). In this embodiment, the current through the overcurrent protection device is approximately at current R between times S1 and S2 until the overcurrent protection device changes to a low conduction state (e.g., fails open) at time S2, at which time the current drops to zero (or a relatively low current). The overcurrent protection device is configured to change to a low conduction state (e.g., fail open) when the current through the overcurrent protection device is above the threshold current CL (which can represent, for example, a rated current of the overcurrent protection device) for at least a specified period of time. In this embodiment, the current is limited to current R based on a resistance of the fault causing the overcurrent event and/or a power supply resistance. In some embodiments, a current profile resulting in the current through the overcurrent protection device exceeding the threshold current CL can be different than that shown in FIG. 3A.

As shown in FIG. 4A, the overcurrent protection device changes to a low conduction state (e.g., fails open) after the current through the overcurrent protection device is above the threshold current CL during time period 412. In some embodiments, the overcurrent protection device may change to the low conduction state (e.g., fail open) when a temperature of the overcurrent protection device causes at least a portion of the overcurrent protection device to, for example, melt in response to current flowing through the overcurrent protection device. Thus, the time period during which the overcurrent protection device changes to the low conduction state (e.g., fails open) can depend on the level of current flowing through the overcurrent protection device, a size of the overcurrent protection device, a thermal conductivity of the overcurrent protection device, a resistivity of the overcurrent protection device, and/or so forth. In some embodiments, the overcurrent protection device can be configured so that the overcurrent protection device changes to the low conduction state (e.g., fails open) after the current to the overcurrent protection devices of the threshold current CL during a time period shorter than time period 412, or during a time period longer than time period 412.

FIG. 4B is a graph that illustrates a temperature of an overvoltage protection portion (e.g., a transient voltage suppression (TVS) device) integrated into the input power protection device with the overcurrent protection device described in connection FIG. 4A. FIG. 4C is a graph that illustrates a current through the overvoltage protection device. The overvoltage protection device can be, for example, a zener diode such as zener diode 220 of the input power protection device 200 shown in FIG. 2. In some embodiments, the overvoltage protection device can be included in, or can be, the overvoltage protection portion 120 of the input power protection device 100 shown in FIG. 1.

As shown in FIG. 4B, in response to the current through the overcurrent protection device increasing to current R (shown in FIG. 4A), the temperature of the overvoltage protection device increases (e.g., increases at nearly a linear rate) between times S1 and S2. Specifically, the temperature of the overvoltage protection device increases between times S1 and S2 in response to heat produced by the overcurrent protection device in response to the current R through the overcurrent protection device. The heat can be thermally conducted through, for example, packaging (e.g., molding) that is used to integrate the overcurrent protection device and the overvoltage protection device into the input power protection device.

After the overcurrent protection device changes to the low conduction state (e.g., fails open) at time S2 (as shown in FIG. 4A), the temperature of the overvoltage protection device begins to decrease (e.g., decreases asymptotically) as shown in FIG. 4B. In some embodiments, the temperature of the overvoltage protection device can decrease because current is limited or no longer flowing through the overcurrent protection device (or through any portion of the input power protection device). In some embodiments, the temperature of the overvoltage protection device can decrease as the overvoltage protection cools via mechanisms such as convection, conduction, and/or so forth. In this embodiment, the overvoltage protection device remains in the voltage regulation state and does not change to the shorted state because the temperature of the overvoltage protection device does not exceed the threshold temperature BT.

As shown in FIG. 4C, the voltage across the overvoltage protection device is approximately constant during operation of the input power protection device until the overcurrent protection device changes to the low conduction state (e.g., fails open) at time T4 (as shown in FIG. 4A). In response to the overcurrent protection device changing to the low conduction state (e.g., failing open), the voltage across the overvoltage protection device drops to zero (or a relatively low value). As shown in FIG. 4C, the voltage across the overvoltage protection device is below a threshold voltage VL of the overvoltage protection device. The threshold voltages VL of the overvoltage protection device can be a voltage (e.g., a voltage regulation limit, a clamping voltage) at which the overvoltage protection device breaks down (e.g., break down voltage of a zener diode) when the overvoltage protection device is in the voltage regulation state. In some embodiments, the voltage across the overvoltage protection device can vary (e.g., increase, decrease) during operation of the input power protection device.

In some embodiments, heat produced by overcurrent protection device in response to the current through the overcurrent protection device increasing (as shown in FIG. 4A) can be transferred to the overvoltage protection device. The temperature of the overvoltage protection device can cause the overvoltage protection device to change to the shorted state (e.g., fail short) and draw a current. In some embodiments, the current drawn through the overvoltage protection device can result in a higher current drawn through the overcurrent protection device (than shown in FIG. 4A) and can cause the overcurrent protection device to change to the low conduction state (e.g., fail open) before time S2. As illustrated by the graphs shown in FIG. 3A through 3D and the graphs shown in FIGS. 4A and 4C, change in the conduction state (e.g., blowing) of the overcurrent protection device can be directly caused by a current above the threshold current CL of the overcurrent protection device or can be initially triggered by a current below the threshold current CL (via the positive feedback loop discussed above).

FIG. 5A is a graph that illustrates a voltage of an overvoltage protection device integrated into an input power protection device. The overvoltage protection device can be, for example, a zener diode such as zener diode 220 of the input power protection device 200 shown in FIG. 2. In some embodiments, the overvoltage protection device can be included in, or can be, the overvoltage protection portion 120 of the input power protection device 100 shown in FIG. 1.

As shown in FIG. 5A, the voltage across the overvoltage protection device increases starting at approximately time U1 until the voltage is at the threshold voltage VL at approximately time U2. In this embodiment, the overvoltage protection device remains in the voltage regulation state and does not change to the shorted state. The voltage across the overvoltage protection device can increase in response to the overvoltage event. In this embodiment, the voltage across the overvoltage protection device is approximately at the threshold voltage VL between times U2 and U3 until the overcurrent protection device changes to a low conduction state (e.g., fails open) at time U3 (shown in FIG. 5B), at which time the voltage drops to zero (or a relatively low value). The threshold voltage VL of the overvoltage protection device can be a voltage (e.g., a voltage regulation limit, a clamping voltage) at which the overvoltage protection device breaks down (e.g., break down voltage of a zener diode) when the overvoltage protection device is in the voltage regulation state. In some embodiments, a voltage profile resulting in the voltage across the overvoltage protection device reaching the threshold voltage VL can be different than that shown in FIG. 5A.

FIG. 5B is a graph that illustrates a current through a overcurrent protection device included in the input power protection device with the overvoltage protection device described in connection FIG. 5A. The overcurrent protection device can be a overcurrent protection device such as fuse 210 of the input power protection device 200 shown in FIG. 2. In some embodiments, the overcurrent protection device can be included in, or can be, an overcurrent protection portion 110 of the input power protection device 100 shown in FIG. 1.

As shown in FIG. 5B, current through the overcurrent protection device increases starting at approximately time U1 until the current is at current V at approximately time U2, which is above the threshold current CL. The current through the overcurrent protection device can increase rapidly in response to the voltage across the overvoltage protection device increasing in response to the overvoltage event. In this embodiment, the current through the overcurrent protection device is approximately at current R between times U2 and U3 until the overcurrent protection device fails open at time U3, at which time the current drops to zero (or a relatively low value). The overcurrent protection device is configured to change to the low conduction state (e.g., fail open) when the current through the overcurrent protection device is above the threshold current CL (which can represent, for example, a rated current of the overcurrent protection device) for at least a specified period of time. In this embodiment, the current is limited to current V because this is the current drawn to cap the voltage across the overvoltage protection device at the threshold voltage VL of the overvoltage protection device.

Similar to the overcurrent protection devices described above, the overcurrent protection device is configured to change to the low conduction state (e.g., fail open) after the current through the overcurrent protection device is above the threshold current CL during a finite period of time. As shown in FIGS. 5A and 5B, the overvoltage protection device the overcurrent protection device are configured so that when the voltage across the overvoltage protection device is at the threshold voltage, current through the overcurrent protection device will cause the overcurrent protection device to change to the low conduction state (e.g., fail open). In other words, the overvoltage protection device and the overcurrent protection device are collectively configured so that the overcurrent protection device will change to the low conduction state (e.g., fail open) at a desirable voltage across the overvoltage protection device.

In this embodiment, the current to the overcurrent protection device increases proportionally with the voltage increase across the overvoltage protection device shown in FIG. 5A. In some embodiments, if a load coupled to the input power protection device is an active load (rather than a resistive load), the current profile through the overcurrent protection device can be different than that shown in FIG. 5B.

Figure 5C:
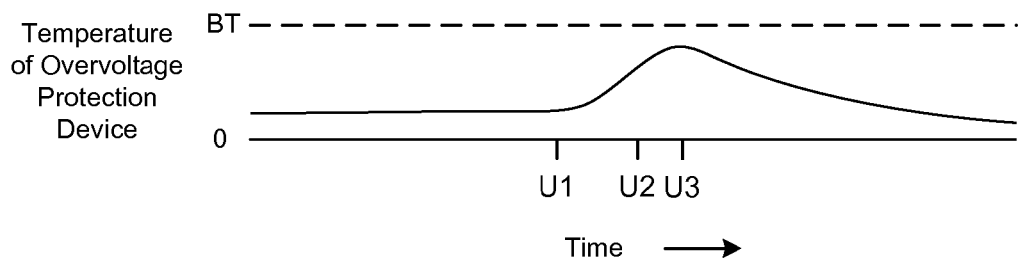

FIG. 5C is a graph that illustrates a temperature of an overvoltage protection portion (e.g., a transient voltage suppression (TVS) device) integrated into the input power protection device with the overcurrent protection device described in FIGS. 5A and 5B. As shown in FIG. 5C, in response to the current through the overcurrent protection device increasing to current V (shown in FIG. 5B), the temperature of the overvoltage protection device increases (e.g., increases at nearly a linear rate) between times U1 and U3, but does not exceed the threshold temperature BT of the overvoltage protection device. Specifically, the temperature of the overvoltage protection device increases between times U1 and U3 in response to heat produced by the overcurrent protection device in response to the current V through the overcurrent protection device. The heat can be thermally conducted through, for example, packaging (e.g., molding), or any other device structure, that is used to integrate the overcurrent protection device and the overvoltage protection device into the input power protection device.

After the overcurrent protection device changes to the low conduction state (e.g., fails open) at time U3 (as shown in FIG. 5B), the temperature of the overvoltage protection device begins to decrease (e.g., decreases asymptotically) as shown in FIG. 5C. In some embodiments, the temperature of the overvoltage protection device can decrease because current is limited or no longer flowing through the overcurrent protection device (or through any portion of the input power protection device). In some embodiments, the temperature of the overvoltage protection device can decrease as the overvoltage protection cools via mechanisms such as convection, conduction, and/or so forth. In this embodiment, the overvoltage protection device remains in the voltage regulation state and does not change to the shorted state because the temperature of the overvoltage protection device does not exceed the threshold temperature BT.

FIG. 6A is a block diagram that illustrates a top cross-sectional view of an input power protection device 600. FIG. 6B is a block diagram that illustrates a side cross-sectional view of the input power protection device 600 shown in FIG. 6A. The side cross-sectional view of the input power protection device 600 shown in FIG. 6B is cut along line P1, which is shown as a dashed line in FIG. 6A. The top cross-sectional view of the input power protection device 600 shown in FIG. 6A is cut along the line P2, which is shown as a dashed line in FIG. 6B.

In the embodiment shown in FIGS. 6A and 6B, the input power protection device 600 includes a fuse 610 that functions as an overcurrent protection portion and a zener diode 620 that functions as an overvoltage protection portion. In this embodiment, the fuse 610 is defined by a wire that is coupled to (e.g., wire bonded to) an input terminal 602 and coupled to (e.g., wire bonded to) a metal plate 624 that is part of the zener diode 620. In other words, the fuse 610 can be a wire bond fuse.

In some embodiments, the fuse 610 can be any type of fuse. For example, the fuse can be a narrow metal structure fuse, an on-diode fuse layer, or can be formed using some other technology. In some embodiments, the fuse 610 can be formed of any type of material such as, for example, aluminum, tin, copper, lead, brass, bronze, nichrome, and/or so forth.

As shown in FIG. 6A, the zener diode 620 can be coupled to an output terminal 604 of the input power protection device 600 via conductors 630. In this embodiment, the conductors 630 include two separate conductors (i.e., two separate wires). In some embodiments, each of the conductors 630 can be made of the same material as the fuse 610. In some embodiments, the conductors 630 can include more or less wires than shown in FIG. 6A.

In some embodiments, each of the conductors 630 can be approximately (e.g., substantially) the same size, material, and resistance as the fuse 610. Because the conductors 630 includes two separate wires and the fuse 610 is made of one wire, the fuse 610 will fail open before the conductors 630 fail open in response to current flowing between the input terminal 602 and the output terminal 604 via the fuse 610 and the conductors 630. The fuse 610 will fail open before the conductors 630 fail open because the cross-sectional area (and resistance) of the fuse 610 is smaller than the collective cross-sectional area (and resistance) of the conductors 630. In some embodiments, the output terminal 604 may be coupled to the zener diode 620 using a device (or connection(s)) different than the conductors 630 shown in FIG. 6A. Examples of different device (or connection(s)) between the zener diode 620 and the output terminal 604 are shown in FIGS. 7A through 8B.

As shown in FIG. 6B, the zener diode 620 includes a semiconductor 621 that has a PN junction 622. The metal plate 624 is disposed on a top portion of the semiconductor 621 and a metal plate 626 is disposed on the bottom portion of the semiconductor 621. In some embodiments, the metal plate 624 and/or the metal plate 626 can be defined by metal disposed on (e.g., sputtered on) the semiconductor 621 using semiconductor processing means. In some embodiments, the metal plate 624 and/or the metal plate 626 may or may not cover the entire top portion and/or bottom portion of the semiconductor 621. In some embodiments, the metal plate 624 and/or the metal plate 626 may be disposed on the semiconductor 621 before the semiconductor 621 is cut (e.g., cut using a saw) into an individual die that can be included in the input power protection device 600. As shown in FIG. 6B, the PN junction of the zener diode 620 is closer to the top portion of the semiconductor 621 than the bottom portion of the semiconductor 621.

As shown in FIG. 6B, the zener diode 620 is coupled directly to a ground terminal 606 via the metal plate 626. Although not shown in FIG. 6A or 6B, in some embodiments, the zener diode 620 may be coupled to the ground terminal 606 via one or more conductors (e.g., one or more wires).

As shown in FIGS. 6A and 6B, the fuse 610, the zener diode 620, the conductor 630, and the terminals (i.e., the input terminal 602, the output terminal 604, the ground terminal 606) are integrated into the input power protection device 600. Specifically, these components are disposed within a container 650 that includes a molding 652 formed around the components. In some embodiments, the container 650 and molding 652 can collectively define a package. In some embodiments, additional components, in addition to those mentioned above, can be included in the input power protection device 600. In some embodiments, additional components can be integrated into the input power protection device 600. In some embodiments, the container 650 can have a cover (e.g., a lid, a bottom portion) that is disposed over the components after the components have been disposed within at least a portion of the container 650. In some embodiments, one or more of the terminals may extend beyond the boundaries of the container 650.

Figure 10:
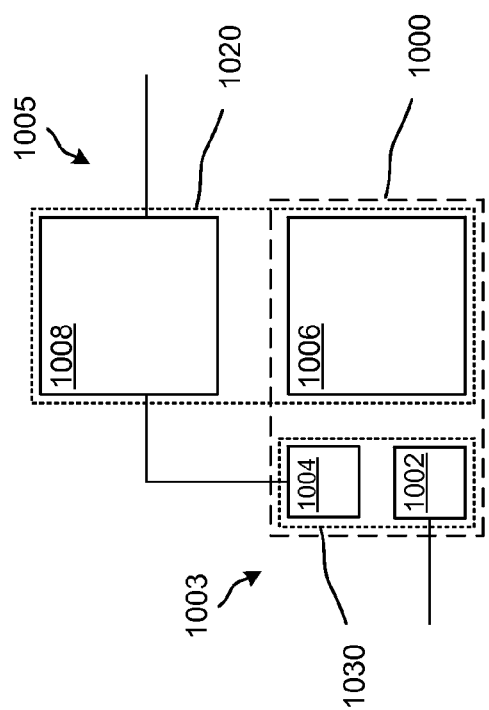
FIG. 10 is a block diagram that illustrates an overcurrent protection socket and an overvoltage protection socket.

As shown in FIG. 6B, each of the terminals is coupled to a pin that can be used to plug the input power protection device 600 into, for example, a printed circuit board (PCB). Specifically, the input terminal 602 is coupled to pin 612, the output terminal 604 is coupled to pin 614, and the ground terminal 606 is coupled to pin 616. An example of a sockets of a printed circuit board into which the input power protection device 600 can be inserted (e.g., plugged) is shown in FIG. 10. In some embodiments, the one or more of the terminals can be coupled to a different type of connector (other than pins) that can be used to couple the input power protection device 600 to a board such as a ball. In some embodiments, one or more of the terminals may not be coupled to pins (as shown) or balls, but can be, or can be coupled to, a pad that can be soldered to a board. In such embodiments, one or more of the pins may optionally be omitted.

FIG. 7A is a block diagram that illustrates a top view of components of an input power protection device. FIG. 7B is a block diagram that illustrates a side view of the components of the input power protection device shown in FIG. 7A. The input power protection device 700 includes a fuse 710 that functions as an overcurrent protection portion and a zener diode 720 that functions as an overvoltage protection portion. In this embodiment, the fuse 710 is defined by a wire that is coupled to (e.g., wire bonded to) an input terminal 702 and coupled to (e.g., wire bonded to) a metal plate 724 that is part of the zener diode 720. In other words, the fuse 710 can be a wire bond fuse. In some embodiments, the fuse 710 can be any type of fuse (e.g., a narrow metal structure fuse, an on-diode fuse layer).

As shown in FIG. 7A, the zener diode 720 can be coupled to an output terminal 704 of the input power protection device 700 via a conductive clip 760. In some embodiments, the conductive clip 760 can be made of any type of conductive material such as, for example, aluminum, gold, and/or so forth. In some embodiments, the conductive clip 760 can be made of the same material as the fuse 710.

In some embodiments, the conductive clip 760 can be configured (e.g., a geometry, a thermal mass, and/or a material type of the conductive clip 760 can be configured) so that the fuse 710 will fail open before the conductive clip 760 fails open in response to current flowing between the input terminal 702 and the output terminal 704 via the fuse 710 and the conductive clip 760. For example, in one such embodiment, the fuse 710 will fail open before the conductive clip 760 fails open because the cross-sectional area (and resistance) of the fuse 710 can be smaller than the collective cross-sectional area (and resistance) of the conductive clip 760.

In some embodiments, use of the conductive clip 760 can facilitate handling of relatively high pulses of energy because the conductive clip 760 can have a relatively large mass (e.g., large surface area) coupled to, for example, the zener diode 720 and/or the output terminal 704. In some embodiments, the conductive clip 760 can have a relatively large mass that can function as a thermal sink (e.g., a thermal heat sink) for the zener diode 720 and/or the output terminal 704. Thus, the zener diode 720 can be a higher power component than if a conductor smaller than the conductive clip 760 were coupled to the zener diode 720.

As shown in FIG. 7B, the zener diode 720 includes a semiconductor 721 that has a PN junction 722. The metal plate 724 is disposed on a top portion of the semiconductor 721 and a metal plate 726 is disposed on the bottom portion of the semiconductor 721. In some embodiments, the metal plate 724 and/or the metal plate 726 can be defined by metal disposed on (e.g., sputtered on) the semiconductor 721 using semiconductor processing needs. In some embodiments, the metal plate 724 and/or the metal plate 726 may not cover the entire top portion or bottom portion of the semiconductor 721. Although not shown in FIG. 7B, the PN junction of the zener diode 720 can be closer to the bottom portion of the semiconductor 721 than the top portion of the semiconductor 721.

As shown in FIG. 7B, the zener diode 720 is coupled directly to a ground terminal 706 via the metal plate 726. Although not shown in FIG. 7A or 7B, in some embodiments, the zener diode 720 may be coupled to the ground terminal 706 via one or more conductors (e.g., one or more wires).

Although not shown in FIG. 7A or FIG. 7B, the components of the input power protection device shown in FIGS. 7A and 7B can be integrated into a package similar to that shown in FIGS. 6A and 6B. In some embodiments, additional components, in addition to those mentioned above, can be included in the input power protection device.

FIG. 8A is another block diagram that illustrates a top view of components of an input power protection device. FIG. 8B is a block diagram that illustrates a side view of the components of the input power protection device shown in FIG. 8A. The input power protection device 800 includes a fuse 810 that functions as an overcurrent protection portion and a zener diode 820 that functions as an overvoltage protection portion. In this embodiment, the fuse 810 is defined by a wire that is coupled to (e.g., wire bonded to) an input terminal 802, and can be a wire bond fuse. In some embodiments, the fuse 810 can be any type of fuse (e.g., a narrow metal structure fuse, an on-diode fuse layer).

As shown in FIG. 8B, the zener diode 820 includes a semiconductor 821 that has a PN junction 822 (which is formed with a p-type semiconductor and an n-type semiconductor). The metal plate 824 is disposed on a top portion of the semiconductor 821 and a metal plate 826 is disposed on the bottom portion of the semiconductor 821. In some embodiments, the metal plate 824 and/or the metal plate 826 can be defined by metal disposed on (e.g., sputtered on) the semiconductor 821 using semiconductor processing techniques. In some embodiments, the metal plate 824 and/or the metal plate 826 may not cover the entire top portion or bottom portion of the semiconductor 821.

As shown in FIG. 8B (and in contrast to the PN junctions described in connection with FIGS. 6B and 7B), the PN junction of the zener diode 820 is closer to the bottom portion of the semiconductor 821 than the top portion of the semiconductor 821. Thus, the zener diode 820 shown in FIG. 8B is inverted compared with the zener diode shown in FIGS. 6B and 7B.

Because the zener diode 820 is inverted (relative to the PN junctions shown above), the PN junction of the zener diode 820 is relatively close to the output terminal 804 and the PN junction of the zener diode 820 may be relatively close to a PCB on which the zener diode 820 may be coupled during use. Accordingly, components (e.g., vias, copper wires or traces) of the PCB can be used as a thermal heat sink to draw heat away from the PN junction of the zener diode 820 (which may be relatively sensitive to temperature). Thus, the power handling of the zener diode 820 may be increased in a desirable fashion.

As shown in FIG. 8B, an output terminal 804 is coupled to a bottom portion of the zener diode 820. Specifically, the metal plate 826 of the zener diode 820 is coupled to the output terminal 804. The fuse 810 is coupled between the input terminal 802 and the output terminal 804 (at a portion 803 of the output terminal 804). Also, as shown in FIG. 8B, the zener diode 820 is coupled to a ground terminal 806 via a conductive clip 860 (which can be the same as or similar to the conductive clip 760 shown in FIGS. 7A and 7B). This is contrasted with the components shown in FIG. 7B, where the zener diode 720 is coupled to the output terminal 704 via the conductive clip 760, and the zener diode 720 is coupled to the ground terminal 706 via the metal plate 726.

Although not shown in FIG. 8A or FIG. 8B, the components of the input power protection device shown in FIGS. 8A and 8B can be integrated into a package similar to that shown in FIGS. 6A and 6B. In some embodiments, additional components, in addition to those mentioned above, can be included in the input power protection device. Although not shown in FIG. 8A or 8B, in some embodiments, the zener diode 820 may be coupled to the ground terminal 806 via one or more conductors (e.g., one or more wires).

FIG. 9A is yet another block diagram that illustrates a top view of components of an input power protection device. FIG. 9B is a block diagram that illustrates a side view of the components of the input power protection device shown in FIG. 9A. The input power protection device 900 includes a fuse 910 that functions as an overcurrent protection portion and a zener diode 920 that functions as an overvoltage protection portion. As shown in FIG. 9A, the zener diode 920 can be coupled to an output terminal 904 of the input power protection device 900 via a conductive clip 960 (which can be the same as or similar to the conductive clips described above). As shown in FIG. 9B, a first portion of the fuse 910 is coupled to (e.g., electrically coupled to) an input terminal 902 using a conductive clip 962, and a second portion of the fuse 910 is coupled to (e.g., electrically coupled to) the conductive clip 960 (and the output terminal 904).

As shown in FIG. 9B, the zener diode 920 includes a semiconductor 921 that has a PN junction 922. A metal plate 924 is disposed on a top portion of the semiconductor 921 and a metal plate 926 is disposed on the bottom portion of the semiconductor 921. In some embodiments, the PN junction 922, the metal plate 924 and/or the metal plate 926 can be similar to those described above.

As shown in FIG. 9B, the zener diode 920 is coupled directly to a ground terminal 906 via the metal plate 926. Although not shown in FIG. 9A or FIG. 9B, in some embodiments, the zener diode 920 may be coupled to the ground terminal 906 via one or more conductors (e.g., one or more wires).

In this embodiment, the fuse 910 is defined by a process layer (e.g., a metal layer) that is disposed on a semiconductor 921 of the zener diode 920. In some embodiments, the fuse 910 can be produced using semiconductor processing techniques. For example, in some embodiments, the fuse 910 can be defined by metal that is deposited on the semiconductor 921 of the zener diode 920 using a sputtering technique. In other words, the fuse 910 and the zener diode 920 can both be formed within a common silicon substrate using semiconductor processing techniques.

Although not shown in FIG. 9A or FIG. 9B, the components of the input power protection device shown in FIGS. 9A and 9B can be integrated into a package similar to that shown in FIGS. 6A and 6B. In some embodiments, additional components, in addition to those mentioned above, can be included in the input power protection device.

FIG. 10 is a block diagram that illustrates an overcurrent protection socket 1003 and an overvoltage protection socket 1005. The overcurrent protection socket 1003 includes pad 1002 and pad 1004. The overvoltage protection socket 1005 includes pad 1006 and pad 1008. In some embodiments, the overcurrent protection socket 1003 and the overvoltage protection socket 1005 can be standard sockets into which standard (e.g., standard size) discrete components may be inserted. Electrical connections between and from the pads (e.g. between pad 1004 and pad 1008) are shown in FIG. 10.

For example, a standard-size, discrete component overvoltage protection device, such as a zener diode, can be inserted into socket 1005 via pads 1006 and 1008. In some embodiments, the discrete component overvoltage protection device can be in an SMB package. A footprint of a standard-size, discrete component overvoltage protection device is shown as outline 1020. Similarly, a standard-size, discrete component overcurrent protection device, such as a fuse, can be inserted into socket 1003 via pads 1002 and 1004. In some embodiments, the discrete component overcurrent protection device can be in a 0402 package. A footprint of a standard-size, discrete component overcurrent protection device is shown as outline 1030.

As shown in FIG. 10, an input power protection device (which integrates an overcurrent protection portion and an overvoltage protection portion) such as those described above can be used to replace separate discrete component overvoltage protection and overcurrent protection devices. A footprint of an input power protection device inserted into at least a portion of the overvoltage protection socket 1005 and the overcurrent protection socket 1003 is shown as outline 1000. As shown in FIG. 10, because the input power protection device may be a three terminal device the input power protection device may not be inserted into at least a portion of the overvoltage protection socket 1005 and/or the overcurrent protection socket 1003. In the embodiment shown in FIG. 10, the input power protection device is not inserted into pad 1008.

As illustrated by FIG. 10, an input power protection device can be configured to be inserted into standard sockets associated with discrete component overvoltage protection devices and/or overcurrent protection devices. Thus, the input power protection device can be configured to replace separate discrete component overvoltage protection devices and/or overcurrent protection devices.

Figure 11:
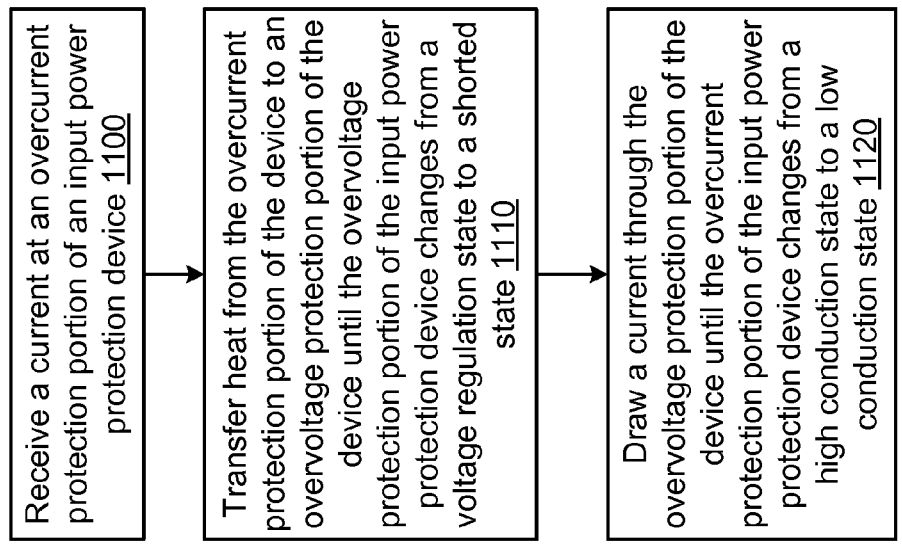
FIG. 11 is a flowchart that illustrates a method for using an input power protection device.

FIG. 11 is a flowchart that illustrates a method for using an input power protection device. In some embodiments, the input power protection device can be similar to, or the same as, any of the input power protection devices described above.

A current is received at an overcurrent protection portion of an input power protection device (block 1100). In some embodiments, the overcurrent protection portion of the input power protection device can be a fuse (e.g., a wire bond fuse, a fuse produced using semiconductor processing techniques) or other type of overcurrent protection device. In some embodiments, the current received at the overcurrent protection portion can be through the overcurrent protection portion and can be below a threshold current (e.g., rated current) of the overcurrent protection portion.

Heat from the overcurrent protection portion of the device is transferred to an overvoltage protection portion of the device until the overvoltage protection portion of the input power protection device changes from a voltage regulation state to a shorted state (e.g., fails short) (block 1110). In some embodiments, the overvoltage protection portion of the input power protection device can be any type of transient voltage suppression device such as a zener diode that is subject to thermal breakdown. The heat can be transferred to the overvoltage protection portion until a temperature of the overvoltage protection portion exceeds a threshold temperature (also can be referred to as a threshold breakdown temperature) and the overvoltage protection portion changes from the voltage regulation state to the shorted stated.

In some embodiments, the overcurrent protection portion may be integrated into (e.g., package within) the input power protection device with the overvoltage protection portion so that heat may be transferred between the overcurrent protection portion and the overvoltage protection portion. In other words, the overvoltage protection portion and the overcurrent protection portion may be integrated into a discrete component that can be included in, for example, a computing device. In some embodiments, the heat may be transferred via a molding injected between the overvoltage protection portion and the overcurrent protection portion.

Once thermal breakdown occurs, a current is drawn through the overvoltage protection portion of the device until the overcurrent protection portion of the device changes from a high conduction state to a low conduction state (e.g., fails open) (block 1120). The current can be drawn through the overvoltage protection portion in response to the overvoltage protection portion changing from the voltage regulation state to the shorted state (e.g., failing short). The current drawn through the overvoltage protection portion can be drawn through the overcurrent protection portion of the input power protection device until the overcurrent protection portion changes from the high conduction state to the low conduction state (e.g., fails open). In some embodiments, if the overcurrent protection portion is a fuse, the fuse can melt and form an open circuit when the fuse changes from the high conduction state to the low conduction state (e.g., fails open).

Figure 12:
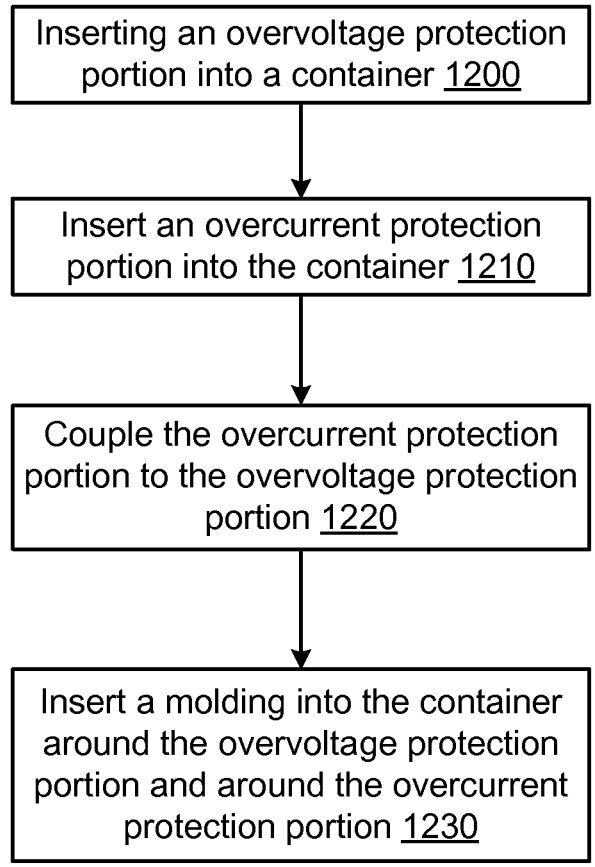
FIG. 12 is a flowchart that illustrates a method for producing an input power protection device.

FIG. 12 is a flowchart that illustrates a method for producing an input power protection device. The method shown in FIG. 12 can be used to produce one or more of the input power protection devices described above. For example, the method shown in FIG. 12 can be used to produce the input power protection device 600 shown in FIGS. 6A and 6B.

As shown in FIG. 12, an overvoltage protection portion is inserted into a container (block 1200). In some embodiments, the overvoltage protection portion can be, or can include, a transient voltage suppression device. In some embodiments, the overvoltage protection portion can be any type of overvoltage protection device such as a zener diode.

An overcurrent protection portion is inserted into the container (block 1210). In some embodiments, the overcurrent protection portion can be a wire bond fuse, or a polysilicon-based fuse. In some embodiments, the overvoltage protection portion and the overcurrent protection portion can be referred to as components of an input power protection device.

The overcurrent protection portion is coupled (e.g., thermally coupled) to the overvoltage protection portion (block 1220). In such embodiments, a portion of the overcurrent protection portion can be wire bonded to, or otherwise electrically coupled to, the overvoltage protection portion. In some embodiments, the overcurrent protection portion can be coupled to metal that is disposed on, or as part of, the overvoltage protection portion.

A molding is inserted into the container around the overvoltage protection portion and around the overcurrent protection portion (block 1230). In some embodiments, the molding can be injected into the container around the overvoltage protection portion and around the overcurrent protection portion. In some embodiments, the molding can be configured to transfer heat between the overvoltage protection portion and the overcurrent protection portion during operation of the overvoltage protection portion and/or the overcurrent protection portion. In some embodiments, the molding and the container can collectively define at least a portion of a package. In some embodiments, a cover can be coupled to the container after the molding has been inserted into the container. In some embodiments, a molding optionally may not be inserted into the container. In such embodiments, block 1230 may be omitted from the process used to produce an input power protection device. In such embodiments, no molding is used, but coupling (e.g., thermal coupling) may be achieved through traditional silicon infrastructures or other device structures.

Figure 13B:
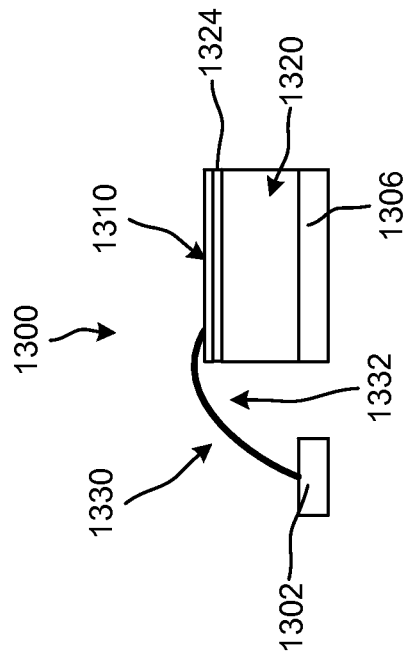
FIG. 13B is a block diagram that illustrates a side view of the input power protection device shown in FIG. 13A.
Figure 13A:
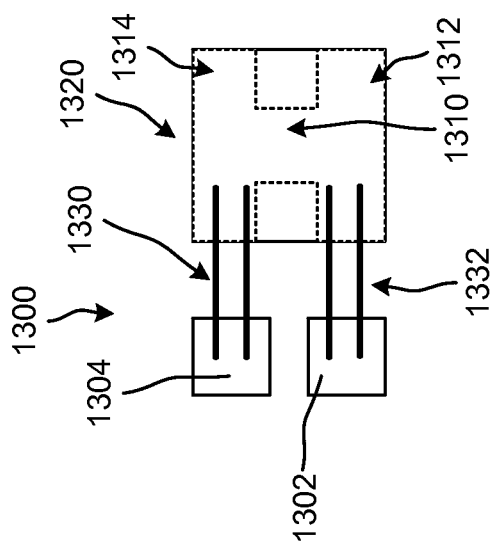
FIG. 13A is a block diagram that illustrates a top view of at least a portion of an input power protection device.

FIG. 13A is a block diagram that illustrates a top view of at least a portion of an input power protection device 1300. FIG. 13B is a block diagram that illustrates a side view of the input power protection device 1300 shown in FIG. 13A.

In the embodiment shown in FIGS. 13A and 13B, the input power protection device 1300 includes a fuse 1310 that functions as an overcurrent protection portion and a zener diode 1320 that functions as an overvoltage protection portion. In this embodiment, the fuse 1310 can be an embedded thin-film metal fuse or polysilicon electronic fuse (e-fuse) structure. For example, the fuse 1310 shown in FIG. 13A has a dog-bone structure and can be, or can include, for example, a tungsten metal deposited on a polysilicon substrate. In some embodiments, the input power protection device 1300 can include a different overcurrent protection portion than the fuse 1310 such as multiple parallel fuse structures and/or a different overvoltage protection portion than the zener diode 1320.

In this embodiment, a bottom portion 1312 of the fuse 1310 is coupled to (e.g., wire bonded to) an input terminal 1302, and a top portion 1314 of the fuse 1310 is coupled to (e.g., wire bonded to) an output terminal 1304. Specifically, the bottom portion 1312 of the fuse 1310 is coupled to the input terminal 1302 with conductors 1332, and the top portion 1314 of the fuse 1310 is coupled to the output terminal 1304 with conductors 1330. In this embodiment, the conductors 1330, 1332 are configured so that the conductors 1330, 1332 will not melt before the fuse 1310 melts (e.g., blows). In some embodiments, one or more conductive clips can be used instead of, or in conjunction with, the conductors 1330, 1332.

Although not shown in FIG. 13B, the zener diode 1320 can include a semiconductor, a PN junction, and one or more metal layers. In this embodiment, an insulation layer 1324 (which is a thermal and electrical insulation layer) is disposed between the fuse 1310 and the zener diode 1320. As shown in FIG. 13B, the zener diode 1320 is coupled directly to a ground terminal 1306. Although not shown in FIG. 13A or 13B, in some embodiments, the zener diode 1320 may be coupled to the ground terminal 1306 via one or more conductors (e.g., one or more wires). Also, although not shown in FIG. 13A or 13B, the fuse 1310 may be coupled to the zener diode 1320 using one or more conductive vias (e.g., metal vias) through the insulation layer 1324.

In some embodiments, the fuse 1310, the zener diode 1320, the conductors 1330, 1332 and the terminals (i.e., the input terminal 1302, the output terminal 1304, the ground terminal 1306) of the input power protection device 1300 can be integrated into a single package. Specifically, these components can be, for example, disposed within a container (not shown) that includes a molding formed around the components.

In some embodiments, one or more conductive plates (e.g., a metal plates) may be disposed on top of the fuse 1310. The conductive plate(s) can function as a heat sink for the input power protection device 1300. In such embodiments, the conductors 1330, 1332 may be electrically connected to the fuse 1310 via the conductive plate(s). In some embodiments, the conductive plate(s) can be configured to distribute heat more evenly across the fuse 1310 (e.g., more evenly across the top portion 1314 and/or the bottom portion 1312 of the fuse 1310) than would otherwise be possible without the conductive plate(s). In some embodiments, the conductive plate(s) can have a thickness (when viewed from the side) that is greater than or less than a thickness (when viewed from the side) of the fuse 1310.

If multiple conductive plates are disposed on top of the fuse 1310, the conductive plates can be separate from one another or can be electrically connected. For example, a first conductive plate may be disposed over (and coupled to) the top portion 1314 of the fuse 1310, and a second conductive plate may be disposed over (and coupled to) the bottom portion 1312 of the fuse 1310.

Figure 14:
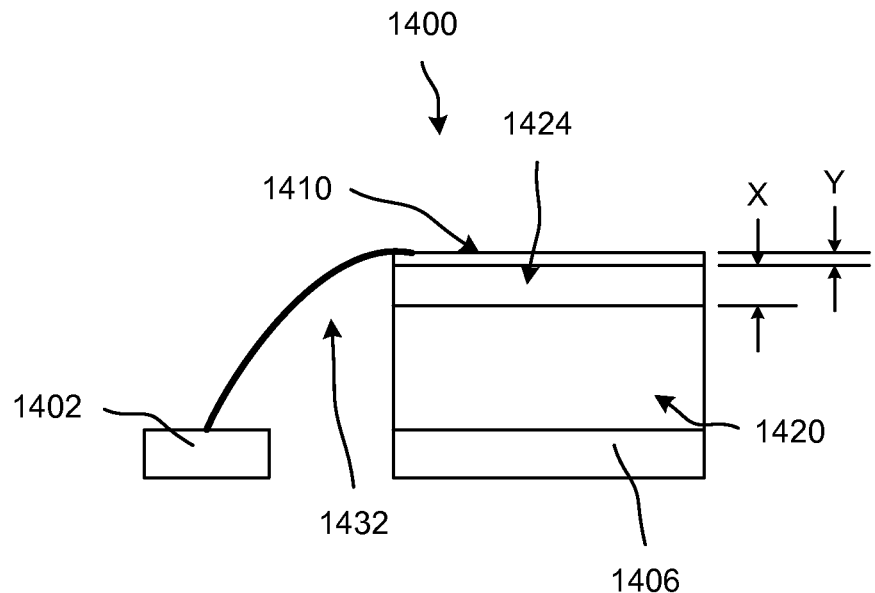
FIG. 14 is a block diagram that illustrates a side view of an input power protection device similar to the input power protection device shown in FIGS. 13A and 13B.

FIG. 14 is a block diagram that illustrates a side view of an input power protection device 1400 similar to the input power protection device 1300 shown in FIGS. 13A and 13B. The input power protection device 1400 includes a fuse 1410 that functions as an overcurrent protection portion and a zener diode 1420 that functions as an overvoltage protection portion. In this embodiment, the fuse 1410 can be an embedded thin-film metal fuse or polysilicon electronic fuse (e-fuse) structure. In some embodiments, the fuse 1410 shown in FIG. 14 can have a dog-bone structure and can be, or can include, for example, a tungsten metal deposited on a polysilicon substrate. In some embodiments, the input power protection device 1400 can include a different overcurrent protection portion than the fuse 1410 and a different overvoltage protection portion than the zener diode 1420.

A first portion of the fuse 1410 can be coupled to (e.g., wire bonded to) an input terminal 1402, and, although not shown, a second portion of the fuse 1410 can be coupled to (e.g., wire bonded to) an output terminal (not shown). Specifically, the first portion the fuse 1410 and the second portion of the fuse 1410 can be coupled to the input terminal 1402 and the output terminal respectively, with one or more conductors 1432 and/or one or more conductive clips. As shown in FIG. 14, the zener diode 1420 is coupled directly to a ground terminal 1406. Although not shown in FIG. 14, in some embodiments, the zener diode 1420 may be coupled to the ground terminal 1406 via one or more conductors (e.g., one or more wires).

Although not shown in FIG. 14, the zener diode 1420 can include a semiconductor, a PN junction, and one or more metal layers. In this embodiment, an insulation layer 1424 (e.g. a thermal and electrical insulation layer) is disposed between the fuse 1410 and the zener diode 1420. Also, although not shown in FIG. 14, the fuse 1410 may be coupled to the zener diode 1420 using one or more conductive vias (e.g., metal vias) through the insulation layer 1424.

In some embodiments, one or more characteristics of the insulation layer 1424 can be configured so that zener diode 1420 (e.g., overvoltage protection portion) will respond to heating from the fuse 1410 (e.g., overcurrent protection portion) in a specified fashion. The characteristic(s) of the insulation layer 1424 can be configured so that heat produced by the fuse 1410 will be transferred to the zener diode 1420 in a desirable fashion. For example, one or more characteristics of the insulation layer 1424 can be defined so that the zener diode 1420 will respond in a specified fashion to heat from the fuse 410 caused by a particular current pulse (e.g., current pulse profile). The response of the fuse 1410 to a particular current pulse (and heat produced therefrom) can be referred to as a fuse pulse response.

The characteristic(s) of the insulation layer 1424 that can be configured so that heat produced by the fuse 1410 will be transferred to the zener diode 1420 in a desirable fashion can include, for example, a thickness of the insulation layer 1424, a material used to define the insulation layer 1424, a property of the insulation layer 1424 (such as a thermal conductivity of the insulation layer 1424 and/or electrical conductivity of the insulation layer 1424), and/or so forth. As a specific example, the insulation layer 1424 can have a thickness X and/or a thermal conductivity that is defined so that heat produced by the fuse 1410 in response to a current pulse have a specified set of characteristics may be transferred to the zener diode 1420 within a specified time period. In other words, the insulation layer 1424 can have a thickness X and/or a thermal conductivity that is defined so that the zener diode 1420 fails short (e.g., changes to a shorted state) in response to a specified profile of a current pulse. In some embodiments, the thickness X and/or a thermal conductivity of the insulation layer 1424 may be defined so that the zener diode 1420 may fail short (e.g., changes to a shorted state) within a specified time period in response to a current pulse through the fuse 1410 that has a specified duration (or range of durations) and/or specified amplitude (or range of amplitudes). In some embodiments, the zener diode 1420 may fail short more quickly in response to a current pulse through the fuse 1410 when the thickness X of the insulation layer 1424 is relatively thin (with relatively strong thermal coupling between the zener diode 1420 and the fuse 1410) than when the thickness X of the insulation layer 1424 is relatively thick (with relatively weak thermal coupling between the zener diode 1420 and the fuse 1410). Similarly, in some embodiments, the zener diode 1420 may fail short more quickly in response to a current pulse through the fuse 1410 when the thermal conductivity of the insulation layer 1424 is relatively high than when the thermal conductivity of the insulation layer 1424 is relatively low.

In some embodiments, one or more characteristics of the insulation layer 1424 can vary across the insulation layer 1424. For example, a thermal conductivity of the insulation layer 1424 can vary vertically (between top and bottom) and/or can vary horizontally (between the left and right or between the front and back). As a specific example, a thermal conductivity of the insulation layer 1424 can be higher towards the edges of the insulation layer 1424 than a center portion of the insulation layer 1424. In such embodiments, heat from the fuse 1410 produced in response to a current may be conducted more rapidly at the edges of the insulation layer 1424 than within the center portion of the insulation layer 1424.

Although not shown in FIG. 14, in some embodiments, a thickness of the insulation layer 1424 can vary, for example, horizontally. As a specific example, the thickness of the insulation layer 1424 can taper from the left to the right. Similarly, in some embodiments, a width/length of the insulation layer 1424 can vary.

As shown in FIG. 14, the fuse 1410 has a thickness Y that is less than the thickness X of the insulation layer 1424. In some embodiments, the thickness X of the insulation layer 1424 can be less than or equal to the thickness Y of the fuse 1410.

In some embodiments, the fuse 1410, the zener diode 1420, the conductor 1430, and the terminals (i.e., the input terminal 1402, the output terminal, the ground terminal 1406) of the input power protection device 1400 can be integrated into a single package. Specifically, these components can be disposed within a container (not shown) that includes a molding formed around the components.

Figure 15:
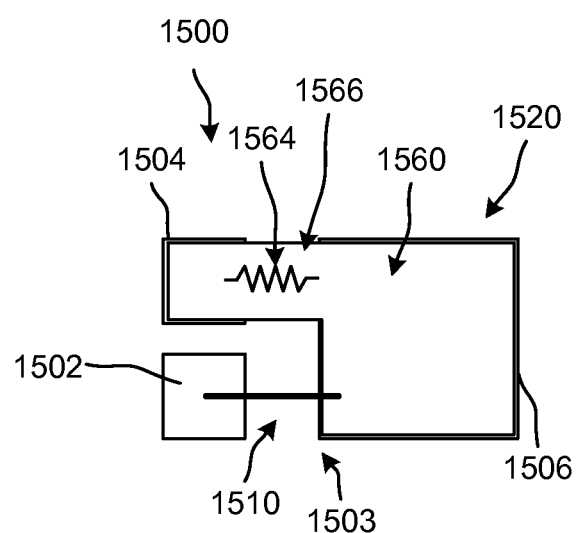
FIG. 15 is a block diagram that illustrates a top view of an input power protection device.

FIG. 15 is a block diagram that illustrates a top view of an input power protection device 1500. The input power protection device 1500 includes a fuse 1510 (in this embodiment, a wire bond fuse) that functions as an overcurrent protection portion and a zener diode 1520 that functions as an overvoltage protection portion. In this embodiment, the fuse 1510 is defined by a wire that is coupled to (e.g., wire bonded to) an input terminal 1502, and can be a wire bond fuse. In some embodiments, the fuse 1510 can be any type of fuse (e.g., a narrow metal structure fuse, an on-diode fuse layer). In some embodiments, the input power protection device 1500 can include a different overcurrent protection portion than the fuse 1510 in a different overvoltage protection portion than the zener diode 1520.

The zener diode 1520 (which is disposed below a conductive clip 1560) can include, for example, a semiconductor that has a PN junction, one or more metal plates. In some embodiments, the metal plates can be defined by metal disposed on (e.g., sputtered on) the semiconductor using semiconductor processing techniques.

As shown in FIG. 15, the zener diode 1520 is coupled to an output terminal 1504 of the input power protection device 1500 via the conductive clip 1560. In some embodiments, the conductive clip 1560 can be made of any type of conductive material such as, for example, aluminum, gold, and/or so forth. In some embodiments, the conductive clip 1560 can be made of the same material as the fuse 1510.

In this embodiment, the zener diode 1520 is coupled directly to a ground terminal 1506, which is disposed below the zener diode 1520. Although not shown in FIG. 15, in some embodiments, the zener diode 1520 may be coupled to the ground terminal 1506 via one or more conductors (e.g., one or more wires).

The conductive clip 1560 can be configured so that the fuse 1510 will fail open (e.g., change from a high conduction state to a low conduction state) before the conductive clip 1560 fails open in response to current flowing between the input terminal 1502 and the output terminal 1504 via the fuse 1510 and the conductive clip 1560.

In this embodiment, heat associated with the output terminal 1504 can be transferred to the zener diode 1520 to fail short (e.g., cause the zener diode to change from a voltage regulation state to a shorted state). For example, a portion 1566 (which can be referred to as a component) of the conductive clip 1560 coupled to the output terminal 1504 can be configured so that a current through the portion 1566 of the conductive clip 1560 may produce heat that can contribute to the operation (e.g., change to a shorted state) of the zener diode 1520 of the input power protection device 1500. In other words, heat produced by the portion 1566 of the conductive clip 1560 and heat produced by the fuse 1510 can collectively trigger operation of the zener diode 1520 (e.g., cause the zener diode 1520 to fail short at a specified current level having a specified duration) of the input power protection device 1500 in accordance with that described above. Thus, a portion of the input power protection device 1500 that is not configured to function as a fuse (such as fuse 1510) can be configured to produce heat to trigger operation (e.g., change to a shorted state) of the zener diode 1520 of the input power protection device 1500.

In some embodiments, one or more characteristics of the portion 1566 of the conductive clip 1560 can be defined so that the portion 1566 produces heat that can cause, or contribute to, the operation (e.g., change to a shorted state) of the zener diode 1520 within the input power protection device 1500. Moreover, one or more characteristics of the portion 1566 of the conductive clip 1560 can be defined so that the portion 1566 produces heat that can cause, or contribute to, the zener diode 1520 failing short in response to a current at a specified level and/or having a specified duration. Thus, one or more characteristics of the portion 1566 of the conductive clip 1560 can be defined so that the portion 1566 produces heat that can cause, or contribute to, the zener diode 1520 failing short at a specified temperature in response to a current at a specified level and/or having a specified duration.

The characteristic(s) of the portion 1566 of the conductive clip 1560 that can be configured to cause the portion 1566 to produce heat in a desirable fashion can include, for example, a size (e.g., thickness, width, links) of the portion 1566, a material used to define the portion 1566, a property of the portion 1566 (such as a thermal conductivity of the portion 1566, the resistivity of the portion 1566, and/or electrical conductivity of the portion 1566). As a specific example, a resistance 1564 of the portion 1566 of the conductive clip 1560 coupled to the output terminal 1504 can be defined so that a current through the portion 1566 of the conductive clip 1560 may produce heat that can contribute to the operation of the zener diode 1520 of the input power protection device 1500.

Although not shown in FIG. 15, in some embodiments, a component coupled to the output terminal 1504 (and separate from the input power protection device 1500) can be configured to produce heat that can be conducted through the output terminal 1504 and the conductive clip 1560 into the zener diode 1520. Thus, a component coupled to the output terminal 1504 can produce heat that can contribute (in conjunction with the portion 1566 of the conductive clip 1560 and/or the fuse 1510) to the operation of the zener diode 1520 of the input power protection device 1500 consistent with the operation described herein.

In some embodiments, the output terminal 1504, or a component associated with the output terminal 1504, can function as a primary heat source configured to trigger the zener diode 1520 to fail short. In such embodiments, the fuse 1510 can function as a secondary heat source configured to trigger the zener diode 1520 to fail short. In some embodiments, the output terminal 1504, or component associated with the output terminal 1504, can function as (or can substantially function as) the only heat source configured to trigger the zener diode 1520 to fail short. In such embodiments, load current sensitive based breakdown (e.g., change to a shorted state) of the zener diode 1520 can be achieved without requiring (or substantially without requiring) thermal coupling with the fuse 1510.

In some embodiments, one or more characteristics of one or more components (e.g., the portion 1566 of the clip 1560) associated with the output terminal 1504 can be tuned with respect to heat produced by other portions of the input power protection device 1500 so that heat produced by the components associated with the output terminal 1504 will produce heat for the zener diode 1520 in a desirable fashion (e.g., a desirable ratio or contribution level to the fuse 1510) at a variety of current levels. For example, one or more components associated the output terminal 1504 can be configured to produce a relatively small amount of heat compared with heat produced by the fuse 1510 at a relatively low current and/or at a relatively high current (e.g., at a current close to a threshold current of the fuse 1510). In some embodiments, one or more components associated the output terminal 1504 can be configured to produce a relatively large amount of heat (without the component(s) failing open) compared with heat produced by the fuse 1510 at a relatively low current and/or at a relatively high current (e.g., at a current close to a threshold current of the fuse 1510). Thus, in some embodiments, relatively high resistance output terminal 1504, and zero (or low) resistance input terminal 1502, may only contribute to heating the zener diode 1520 if a load current is present (from a power source). Also, in some embodiments, a relatively high resistance input terminal 1502, and zero (or low) resistance output terminal 1504, may contribute to heating the zener diode 1520 regardless of whether current is flowing though the zener diode 1520 and/or the output terminal 1504.

Although not shown in FIG. 15, the components of the input power protection device 1500 shown in FIG. 15 can be integrated into a package, for example, similar to that shown in FIGS. 6A and 6B.

FIG. 16A is a schematic that illustrates a three-terminal overvoltage protection device 1605 that includes an overvoltage protection portion 1620. In some embodiments, the overvoltage protection portion 1620 can be, for example, a zener diode. As shown in FIG. 16A, the overvoltage protection device 1605 includes an input terminal 1602, an output terminal 1604, and a ground terminal 1606. Also, the overvoltage protection device 1605 includes an input resistance 1601 associated with the input terminal 1602, and an output resistance 1603 associated with the output terminal 1604.

In this embodiment, the overvoltage protection device 1605 does not include an overcurrent protection portion, and thus, is not referred to as an input power protection device. However, the overvoltage protection device 1605 can be coupled to, for example, an overcurrent protection device (not shown) such as a fuse device (which can be a separate discrete component). Thus, the overvoltage protection device 1605 and the fuse device can collectively provide input power protection to, for example, a load (not shown).

Even though the overvoltage protection device 1605 in FIG. 16A does not include an overcurrent protection portion, the overvoltage protection device 1605 can be configured to leverage the input resistance 1601 and the output resistance 1603 to monitor load current and drive the overvoltage protection portion 1620 to achieve a critical breakdown temp (e.g., exceed a threshold temperature) and trigger a change of the overvoltage protection portion 1620 from a voltage regulation state to a shorted state. Specifically, heat can be produced through the input resistance 1601 and/or the output resistance 1603, and the heat can be transferred to the overvoltage protection portion 1620. In response to the heat, the overvoltage protection portion 1620 can be configured to fail short (e.g., change from a voltage regulation state to a shorted state) at a specified current (e.g., load current) despite the lack of an overvoltage event. In some embodiments, the input resistance 1601 and/or the output resistance 1603 can be used to generate the heat necessary, at a predetermined current between the input terminal 1602 and the output terminal 1604 to cause, or contribute to, breakdown of the overvoltage protection portion 1620 that can then cause an increase in current through an upstream fuse (not shown), which can cause the fuse to fail open (e.g., blow) (e.g., change from a high conduction state to a low conduction state). Thus, thermal breakdown of the overvoltage protection portion 1620 (to a shorted state) can still be achieved using the input resistance 1601 and/or the output resistance 1603 without an overcurrent protection portion being integrated into the overvoltage protection device 1605 with the overvoltage protection portion 1620.

In some embodiments, the three-terminal overvoltage protection device 1605 can be used downstream of a fuse (not shown), and can be tuned (e.g., tuned using the input resistance 1601 and/or the output resistance 1603) to fail short at a current level, for example, below a threshold current of the fuse, thereby changing the collective fusing response of the system and preventing a fuse over-temperature condition. In other words, the overvoltage protection portion 1620 can be configured so that at the current level, the shorting of the overvoltage protection portion 1620 of the overvoltage protection device 1605 can trigger an upstream fuse to fail open (through a relatively large current draw) without fuse to overvoltage protection portion 1620 thermal conductivity within a single integrated package.

In some embodiments, multiple overvoltage protection devices such as overvoltage protection device 1605 shown in FIG. 16A can be coupled to a single fuse device. In some embodiments, the multiple overvoltage protection devices can be coupled in parallel with the single fuse device for redundancy, to reduce the number of fuses needed to protect multiple parallel loads, or for other functional purposes. For example, a first overvoltage protection device and a second overvoltage protection device can have approximately the same threshold current and can be connected in parallel with a single fuse. Each of the first overvoltage protection device and the second overvoltage protection device can be associated with a parallel load line (and each load line could be coupled to separate loads (e.g., parallel loads)). If the first overvoltage protection device malfunctions and does not fail short (change to a shorted state) at the threshold current, the second overvoltage protection device can be configured to fail short at the threshold current in a redundant fashion.

In some embodiments, multiple overvoltage protection devices that are configured to fail short in response to different current profiles can be coupled in parallel with a single fuse device. For example, a first overvoltage protection device can be configured to fail short in response to a first current profile (and/or heat profile responsive to the first current profile), and the second overvoltage protection device can be configured to fail short in response to a second current profile (and/or heat profile responsive to the second current profile). The first overvoltage protection device and/or the second overvoltage protection device can be configured to drive the fuse to fail open even though no load (associated with the first overvoltage protection device or second overvoltage protection device) exceeds the current rating of the fuse.

In some embodiments, the three-terminal overvoltage protection device 1605 can be configured to conduct current from a power supply (not shown) through the input terminal 1602 and the output terminal 1604 to a downstream load (not shown) operably coupled to the output terminal 1604. Thus, the overvoltage protection device 1605 can be disposed between the power supply and the downstream load. In some embodiments, the three-terminal overvoltage protection device 1605 can be operably coupled to the downstream load and to a board (e.g., PCB) via soldered connections.

FIG. 16B is a schematic that illustrates an example of a power supply 1690 and a load L1 coupled to the overvoltage protection device 1605 shown in FIG. 16A. In some embodiments, the load L1 can be, or can include, for example, electronic components (e.g., sensors, transistors, microprocessors, application-specific integrated circuits (ASICs), discrete components, circuit boards) that could be damaged in an undesirable fashion by relatively rapid increases in current and/or voltage produced by the power supply 1690.

Referring back to FIG. 16A, in some embodiments, the three-terminal overvoltage protection device 1605 can be configured to become decoupled at a specified current level so that a downstream load operably coupled to the output terminal 1604 of the overvoltage protection device 1605 will be protected. For example, the three-terminal overvoltage protection device 1605 can be operably coupled to a downstream load (receiving current from a power supply via the three-terminal overvoltage protection device 1605) and to a board via soldered connections. The three-terminal overvoltage protection device 1605 can be configured to increase in temperature in response to a current at, or above, a specified level (e.g., a threshold current) until one or more of the soldered connections of the three-terminal overvoltage protection device 1605 melts and the three-terminal overvoltage protection device 1605 becomes decoupled from the board (and from the downstream load). Because the three-terminal overvoltage protection device 1605 is a three-terminal overvoltage protection device 1605 (with a series portion between terminals 1602 and 1604, and a parallel portion to ground 1606 including the overvoltage protection portion 1620) disposed between the power supply and the load, current to the downstream load coupled to the output terminal 1604 will be cut off when the three-terminal voltage protection device 1605 is decoupled (e.g., removed). Accordingly, the downstream load may be protected from the current provided by the power supply at, or above, the specified current level. A typical two-terminal overvoltage protection device may not provide protection to a downstream load as described above because an open circuit may not be produced if the two-terminal device becomes decoupled from a board (because the typical two-terminal overvoltage protection device will be in parallel with the power source).

In some embodiments, the three-terminal overvoltage protection device 1605 can be configured to become decoupled (and protect a downstream load) after, or when, the overvoltage protection device 1605 has failed short (e.g., changed to a shorted state) in response to heat caused by a current through the overvoltage protection device 1605. The overvoltage protection device 1605 can become decoupled from a board so that an open circuit between a power supply and the downstream load is produced. For example, the overvoltage protection device 1605 can be configured to fail short (e.g., change to a shorted state) in response to heat caused by a current through the overvoltage protection device 1605. In response to the overvoltage protection device 1605 failing short, the current through the overvoltage protection device 1605 can increase and cause additional heating within the overvoltage protection device 1605 that melts one or more soldered connections to the overvoltage protection device 1605 so that the overvoltage protection device 1605 becomes operably decoupled from a downstream load (to create an open circuit and protect the downstream load). In some embodiments, a current level at which the overvoltage protection by 1605 fail short can be defined (e.g., tuned) using the input resistance 1601 and/or the output resistance 1603.

In some embodiments, the three-terminal overvoltage protection device 1605 can be configured to become decoupled (and protect a downstream load) (e.g., decoupled from a board) before the overvoltage protection device 1605 has failed short (e.g., changed to a shorted state) in response to heat caused by a current through the overvoltage protection device 1605. For example, the overvoltage protection device 1605 can be configured to increase in temperature in response to heat caused by a current through the overvoltage protection device 1605. The increase in temperature of the overvoltage protection device 1605 can cause, for example, one or more soldered connections coupled to the overvoltage protection device 1605 to melt so that the overvoltage protection device 1605 becomes decoupled from, for example a board. In some embodiments, a current level at which the overvoltage protection device 1605 becomes decoupled can be defined (e.g., tuned) using the input resistance 1601 and/or the output resistance 1603.

FIG. 16C is a block diagram that illustrates a top view of an implementation of the overvoltage protection device 1605 shown in FIG. 16A. As shown in FIG. 16A, the overvoltage protection device 1605 includes a zener diode 1620 that functions as an overvoltage protection portion. In some embodiments, the overvoltage protection device 1605 can include a different overvoltage protection portion than the zener diode 1620. The zener diode 1620 (which is disposed below a conductive clip 1660) can include, for example, a semiconductor that has a PN junction, one or more metal plates disposed on (e.g., sputtered on) the semiconductor using semiconductor processing techniques, and/or so forth.

As shown in FIG. 16C, the zener diode 1620 is coupled to an output terminal 1606 or 1602 of the overvoltage protection device 1605 via the conductive clip 1660. In this embodiment, the zener diode 1620 is coupled directly to a ground terminal 1604, which is disposed below the zener diode 1620. Also, the overvoltage protection device 1605 includes an input resistance 1601 associated with the input terminal 1602, and an output resistance 1603 associated with the output terminal 1606.

Even though the overvoltage protection device 1605 in FIG. 16C does not include an overcurrent protection portion, the overvoltage protection device 1605 can be configured to leverage the input resistance 1601 and the output resistance 1603 to monitor load current and drive the overvoltage protection portion 1620 to achieve a critical breakdown temp (e.g., exceed a threshold temperature). Specifically, heat can be produced through the input resistance 1601 and/or the output resistance 1603, and the heat can be transferred to the overvoltage protection portion 1620. In response to the heat, the overvoltage protection portion 1620 can be configured to fail short (e.g., change from a voltage regulation state to a shorted state) at a specified current (e.g., load current) despite the lack of an overvoltage event. In some embodiments, the input resistance 1601 and/or the output resistance 1603 can be used to generate the heat necessary, at a predetermined current between the input terminal 1602 and the output terminal 1604 to cause, or contribute to, breakdown of the overvoltage protection portion 1620 (e.g., change to a shorted state) that can then cause an increase in current through, for example, an upstream fuse (not shown), which can cause the fuse to fail open (e.g., blow). Thus, thermal breakdown of the overvoltage protection portion 1620 can still be achieved using the input resistance 1601 and/or the output resistance 1603 without an overcurrent protection portion being integrated into the overvoltage protection device 1605 with the overvoltage protection portion 1620.

Figure 17A:
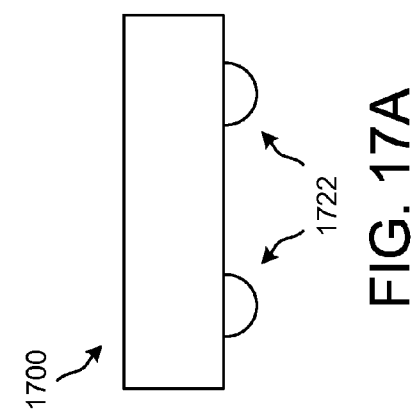
FIG. 17A is a side view of an input power protection device, according to an embodiment.

FIG. 17A is a side view of an input power protection device 1700, according to an embodiment. As shown in FIG. 17A, the input power protection device 1700 is implemented as a chip-scale package (CSP) device. In some embodiments, the chip-scale package device can be referred to as a chip-size packaging device. In some embodiments, the input power protection device 1700 is less than or equal to 1.5 times the size of the die of an overvoltage protection portion (e.g., a zener diode) of the input power protection device 1700. In some embodiments, the input power protection device 1700 is greater than 1.5 times the size of the die of an overvoltage protection portion (e.g., a zener diode) of the input power protection device 1700. As shown in FIG. 17A, the input power protection device 1700 has pads or balls (e.g., a ball grid array (BGA)) 1722 that can be used to couple the input power protection device 1700 to for example, a board (e.g., a PCB). In some embodiments, the input power protection device 1700 can be implemented as a wafer level chip scale package (WL-CSP). Although not shown in FIG. 17A, the overvoltage protection device 1605 shown in FIG. 16A can be implemented as a CSP such as that show in FIG. 17A.

Figure 17B:
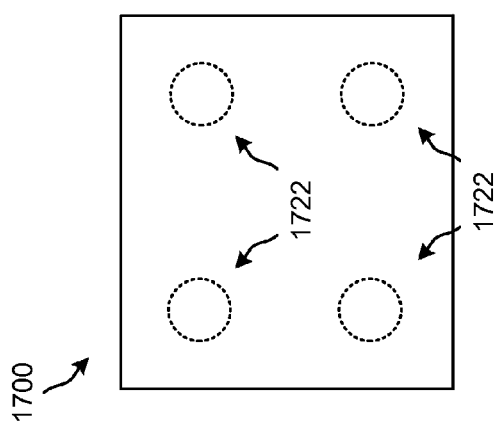
FIG. 17B is a top view of the input power protection device shown in FIG. 17A, according to an embodiment.

FIG. 17B is a top view of the input power protection device 1700 shown in FIG. 17A, according to an embodiment. As shown in FIG. 17B the input power protection device 1700 has four pads 1722. In some embodiments, the input power protection device 1700 can have more or less pads 1722 than are shown in FIG. 17B. In some embodiments, one or more of the pads 1722 can include, or can be, an input terminal, an output terminal, and/or a ground terminal. In some embodiments, the input power protection device 1700 can be an implementation of the three-terminal overvoltage protection device 1605 shown in FIGS. 16A through 16C. In such embodiments, two of the pads 1722 can be associated with one of the terminals (e.g., input terminal, output terminal, ground terminal).

Any of the embodiments described herein can be implemented in a CSP device. For example, the input power protection device shown in FIGS. 7A and 7B can be implemented as a CSP device. In such embodiments, wire bonds, clips, and/or wire routing can be replaced with balls and/or can be implemented using silicon processing structures.

Figure 18A:
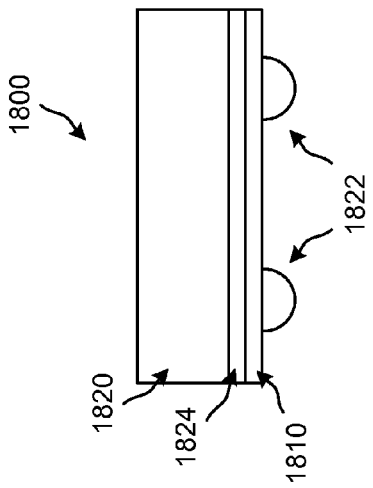
FIG. 18A is a side view of another input power protection device, according to an embodiment.

FIG. 18A is a side view of another input power protection device 1800, according to an embodiment. As shown in FIG. 18A, the input power protection device 1800 is implemented as a CSP device. As shown in FIG. 18A, the input power protection device 1800 has pads or balls (e.g., a ball grid array (BGA)) 1822 that can be used to couple the input power protection device 1800 to for example, a board (e.g., a PCB).

In some embodiments, the input power protection device 1800 can be implemented as a wafer level chip scale package (WL-CSP).

In this embodiment, the input power protection device 1800 includes an overcurrent protection portion 1810 (e.g., a fuse) and an overvoltage protection portion 1820 (e.g., a zener diode, a TVS device). In this embodiment, an insulation layer 1824 is disposed between the overcurrent protection portion 1810 and the overvoltage protection portion 1820. In some embodiments, the overcurrent protection portion 1810 can be an embedded thin-film metal fuse or polysilicon electronic fuse (e-fuse) structure. In some embodiments, the overcurrent protection portion 1810 can be, or can include, for example, a tungsten metal deposited on a polysilicon substrate.

Figure 18B:
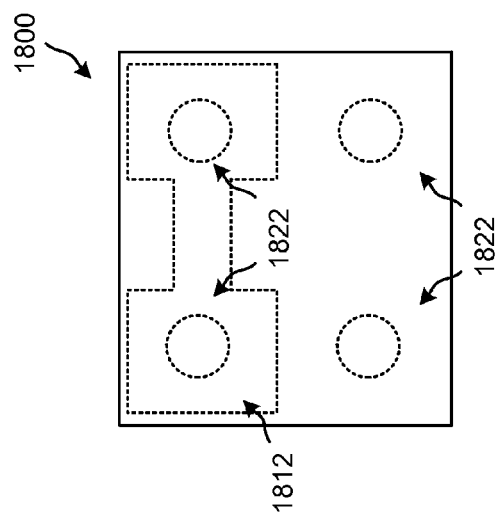
FIG. 18B is a top view of the input power protection device shown in FIG. 18A, according to an embodiment.

FIG. 18B is a top view of the input power protection device 1800 shown in FIG. 18A, according to an embodiment. As shown in FIG. 18B the input power protection device 1800 has four pads 1822. In some embodiments, the input power protection device 1800 can have more or less pads 1822 than are shown in FIG. 18B. In some embodiments, one or more of the pads 1822 can include, or can be, an input terminal, an output terminal, and/or a ground terminal. In this embodiment, the overcurrent protection portion 1810 includes a fuse 1812 portion.

Figure 19B:
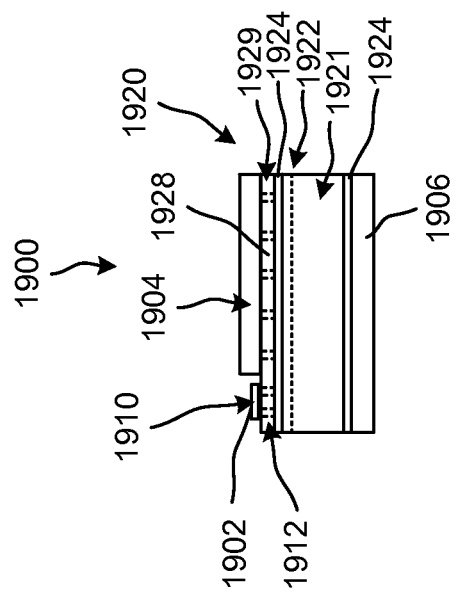
FIG. 19B is a block diagram that illustrates a side view of the components of the input power protection device shown in FIG. 19A.
Figure 19A:
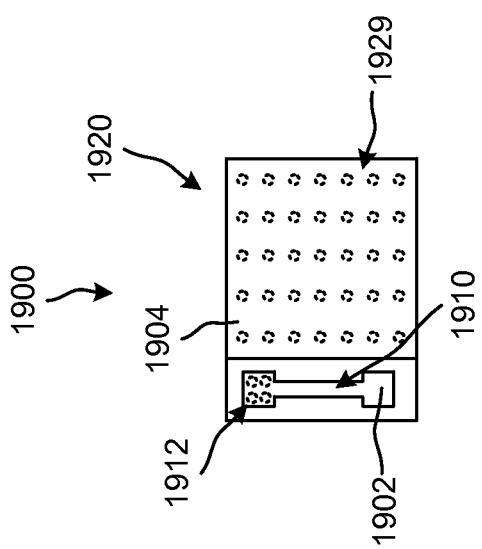
FIG. 19A is yet another block diagram that illustrates a top view of components of an input power protection device.

FIG. 19A is yet another block diagram that illustrates a top view of components of an input power protection device 1900. FIG. 19B is a block diagram that illustrates a side view of the components of the input power protection device 1900 shown in FIG. 19A. The input power protection device 1900 includes a fuse 1910 (in this case a dog-bone shaped fuse) that functions as an overcurrent protection portion and a zener diode 1920 that functions as an overvoltage protection portion. As shown in FIG. 19A, the zener diode 1920 can be coupled to an output terminal 1904 of the input power protection device 1900 through the vias 1929 (through an insulator 1928 shown in FIG. 19B). As shown in FIG. 19B, a first portion of the fuse 1910 can function as, or can be coupled to (e.g., electrically coupled to) an input terminal 1902 (using a conductive clip that is not shown), and a second portion of the fuse 1910 is coupled to (e.g., electrically coupled to) the output terminal 1904 through the vias 1912 (through the insulator 1928 shown in FIG. 19B).

As shown in FIG. 19B, the zener diode 1920 includes a semiconductor 1921 that has a PN junction 1922 and metal plates 1924 that are disposed on a top portion and on a bottom portion of the semiconductor 1921. In some embodiments, the PN junction 1922 and/or the metal plates 1924 can be similar to those described above. As shown in FIG. 19B, the zener diode 1920 is coupled directly to a ground terminal 1906 via the metal plate 1924 on the bottom portion of the semiconductor 1921.

In this embodiment, the fuse 1910 is defined by a process layer (e.g., a metal layer) that is disposed on a semiconductor 1921 of the zener diode 1920. In some embodiments, the fuse 1910 and/or vias can be produced using semiconductor processing techniques. For example, in some embodiments, the fuse 1910 can be defined by a metallic material that is deposited on the semiconductor 1921 of the zener diode 1920 using a sputtering technique. In other words, the fuse 1910 and the zener diode 1920 can both be formed within a common silicon substrate using semiconductor processing techniques. The output terminal 1904 and the fuse 1910 can be insulated from the semiconductor 1921 and the metal plate 1924 on the top portion of the semiconductor 1921 by the insulator 1928.

Although not shown in FIG. 19A or FIG. 19B, in some embodiments, the output terminal 1904 (or solder and/or a molding that can function as an output terminal) can be directly coupled to the metal plate 1924 on the top portion of the semiconductor 1921 and/or can be directly coupled to the semiconductor 1921. In such embodiments, the insulator 1928 may not be disposed between the output terminal 1904 and the semiconductor 1921 (and/or metal plate 1924 above the semiconductor 1921). In such embodiments, at least a portion of the insulator 1928 may be etched away before the output terminal 1904 is disposed on at least a portion of the metal plate 1924 and/or on at least a portion of the semiconductor 1921.

Although not shown in FIG. 19A or 19B, in some embodiments, the input power protection device 1900 may be capped with an insulative (e.g., electrically insulative, thermally insulative) material (or coating) and/or a material (or coating) that provides structural support, to optimize (e.g., modify) fuse performance, and/or to shield the fuse from interactions with the outside environment. For example, the input power protection device 1900 may be capped (or coated) with a glass material, a polysilicon material, and/or so forth.

Although not shown in FIG. 19A or FIG. 19B, the components of the input power protection device shown in FIGS. 19A and 19B can be integrated into a package similar to that shown in FIGS. 6A and 6B. In some embodiments, additional components, in addition to those mentioned above, can be included in the input power protection device. In some embodiments, the input power protection device 1900 shown in FIGS. 19A and 19B can be implemented as a CSP device.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
an overvoltage protection portion, the overvoltage protection portion including a two-terminal diode device; and
an overcurrent protection portion operably coupled to the overvoltage protection portion such that heat produced by the overcurrent protection portion at a current below a rated current of the overcurrent protection portion causes the overvoltage protection portion to irreversibly change from a voltage regulation state to a shorted state during a first time period, the current drawn by the overvoltage protection portion causes the overcurrent protection portion to fail open during a second time period after the first time period.

2. The apparatus of claim 1, wherein the overvoltage protection portion and the overcurrent protection portion are integrated into a single, discrete component.

3. The apparatus of claim 1, wherein the heat produced by the overcurrent protection portion at the current below the rated current of the overcurrent protection portion causes a temperature of the overvoltage protection portion to increase until the overvoltage protection portion changes from the voltage regulation state to the shorted state.

4. The apparatus of claim 1, further comprising:
an output terminal coupled to the overvoltage protection portion via a conductor having a resistance lower than a resistance of the overcurrent protection portion.

5. The apparatus of claim 1, further comprising:
an output terminal coupled to the overvoltage protection portion via a plurality of conductors each having a resistance substantially equal to a resistance of the overcurrent protection portion.

6. The apparatus of claim 1, further comprising:
an output terminal; and
a conductive clip coupled to the overvoltage protection portion, the overcurrent protection portion, and the output terminal.

7. The apparatus of claim 1, wherein the overvoltage protection portion and the overcurrent protection portion are defined within a common silicon substrate.

8. The apparatus of claim 1, wherein the irreversible change is an irreversible physical change.

9. The apparatus of claim 1, wherein the overvoltage protection portion is at least one of a transient voltage suppression device diode or a zener diode and the overcurrent protection portion is a fuse.

10. The apparatus of claim 1, wherein the overvoltage protection portion is configured to irreversibly change from the voltage regulation state to the shorted state at a voltage across the overvoltage protection portion below a breakdown voltage of the overvoltage protection portion.

11. An apparatus, comprising:
an overcurrent protection portion; and
an overvoltage protection portion coupled to the overcurrent protection portion such that a thermally triggered irreversible change from a voltage regulation state to a shorted state of the overvoltage protection portion triggers a low conduction state of the overcurrent protection portion, the overvoltage protection portion including a two-terminal diode device,
the change of the overvoltage protection portion from the voltage regulation state to the shorted state being triggered by heat produced by the overcurrent protection portion and conductively transferred to the overvoltage protection portion at a current below a rated current of the overcurrent protection portion.

12. The apparatus of claim 11, wherein the thermally triggered change of the overvoltage protection portion triggers the overcurrent protection portion to fail open.

13. The apparatus of claim 11, wherein the overvoltage protection portion is at least one of a transient voltage suppression device diode or a zener diode and the overcurrent protection portion is a fuse.

14. The apparatus of claim 11, wherein the overcurrent protection portion and the overvoltage protection portion are integrated into a single package having an output terminal electrically coupled to the overvoltage protection portion, a ground terminal electrically coupled to the overvoltage protection portion, and an input terminal electrically coupled to the overcurrent protection portion.

15. The apparatus of claim 11, wherein the overvoltage protection portion is integrated within a package with the overcurrent protection portion such that heat is transferred from the overcurrent protection portion to trigger the change of the overvoltage protection portion from the voltage regulation state to the shorted state at the current below the rated current of the overcurrent protection portion within a specified time period.

16. The apparatus of claim 11, further comprising:
an output terminal coupled to the overvoltage protection portion via a conductor having a resistance lower than a resistance of the overcurrent protection portion.

17. The apparatus of claim 11, wherein the overcurrent protection portion and the overvoltage protection portion have a common silicon substrate.

18. The apparatus of claim 11, wherein a first terminal of the two-terminal diode device is coupled to the overcurrent protection portion, and a second terminal of the two-terminal diode device is coupled to ground.

19. The apparatus of claim 11, wherein the thermally triggered change is triggered in response to thermal breakdown of the overvoltage protection portion, the overvoltage protection portion is configured such that the thermal breakdown occurs at a critical thermal breakdown temperature lower than a temperature at which the overcurrent protection portion physically changes to an open circuit.

20. The apparatus of claim 11, wherein the overvoltage protection portion is configured to change from the voltage regulation state to the shorted state at a voltage across the overvoltage protection portion below a breakdown voltage of the overvoltage protection portion.

21. A method, comprising:
receiving an overvoltage protection portion having a substrate, the overvoltage protection portion including a two-terminal diode device;
disposing the overvoltage protection portion into a container, the overvoltage protection portion being electrically and thermally coupled to an overcurrent protection portion disposed within the container; and
inserting a molding into the container around the overvoltage protection portion and the overcurrent protection portion, the molding being a thermally conductive material configured to transfer heat produced by the overcurrent protection portion at a current below a rated current of the overcurrent protection portion to the overvoltage protection portion such that the overvoltage protection portion irreversibly fails short during a first time period and the current drawn by the overvoltage protection portion during the first time period causes the overcurrent protection portion to fail open during a second time period after the first time period.

22. The method of claim 21, further comprising:
disposing a metal on the substrate to define the overcurrent protection portion.

23. The method of claim 21, further comprising:
inserting the overcurrent protection portion into the container, the overcurrent protection portion being coupled to the overvoltage protection portion after the inserting of the overvoltage protection portion into the container.

24. The method of claim 21, wherein the overvoltage protection portion is configured to irreversibly fail short at a voltage across the overvoltage protection portion below a threshold voltage of the overvoltage protection portion.

* * * * *